(12) United States Patent
Hanaoka

(10) Patent No.: US 8,275,014 B2
(45) Date of Patent: Sep. 25, 2012

(54) SURFACE-EMITTING LASER ELEMENT, SURFACE-EMITTING LASER ARRAY, OPTICAL SCANNING DEVICE, AND IMAGE FORMING APPARATUS

(75) Inventor: Katsunari Hanaoka, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 12/952,284

(22) Filed: Nov. 23, 2010

(65) Prior Publication Data

US 2011/0123227 A1 May 26, 2011

(30) Foreign Application Priority Data

Nov. 26, 2009 (JP) ................................ 2009-268226
Jul. 9, 2010 (JP) ................................ 2010-156453

(51) Int. Cl.
*H01S 5/00* (2006.01)
(52) U.S. Cl. ................. 372/50.124; 372/43.01
(58) Field of Classification Search ............... 372/43.01, 372/50.124
See application file for complete search history.

(56) References Cited

U.S. PATENT DOCUMENTS

| | | | |
|---|---|---|---|
| 6,905,900 B1 | 6/2005 | Johnson et al. | |
| 7,829,904 B2 * | 11/2010 | Coffa et al. | 257/98 |
| 2003/0026308 A1 | 2/2003 | Iwai et al. | |
| 2003/0031221 A1 | 2/2003 | Wang et al. | |
| 2004/0066819 A1 | 4/2004 | Johnson et al. | |
| 2004/0066820 A1 | 4/2004 | Johnson et al. | |
| 2004/0191941 A1 * | 9/2004 | Morgan et al. | 438/27 |
| 2004/0213311 A1 | 10/2004 | Johnson et al. | |
| 2005/0286597 A1 * | 12/2005 | Mukoyama et al. | 372/50.23 |
| 2007/0014324 A1 | 1/2007 | Maeda et al. | |
| 2008/0180772 A1 * | 7/2008 | Miyatake et al. | 359/204 |
| 2009/0180506 A1 | 7/2009 | Maeda et al. | |

FOREIGN PATENT DOCUMENTS

| | | |
|---|---|---|
| JP | 2001-156395 | 6/2001 |
| JP | 2003-115634 | 4/2003 |
| JP | 2004-289033 | 10/2004 |
| JP | 2006-210429 | 8/2006 |
| JP | 2007-201398 | 8/2007 |

OTHER PUBLICATIONS

Mar. 7, 2011 European search report in connection with counterpart European patent application No. 10 19 2712.

* cited by examiner

*Primary Examiner* — Jessica Stultz
*Assistant Examiner* — Phillip Nguyen
(74) *Attorney, Agent, or Firm* — Cooper & Dunham LLP

(57) ABSTRACT

A surface-emitting laser element includes a substrate; a plurality of semiconductor layers laminated on the substrate, the plural semiconductor layers including a resonator structural body including an active layer and semiconductor multilayer film reflection mirrors having the resonator structural body sandwiched therebetween; an electrode provided in such a manner as to surround a emitting region on a surface of the surface-emitting laser element from which light is emitted; and a dielectric film provided in the emitting region such that a reflection ratio of a peripheral part of the emitting region is different from a reflection ratio of a center part of the emitting region. Edge portions that are near edges of the dielectric film are tilted with respect to the surface.

19 Claims, 41 Drawing Sheets

FIG.6A
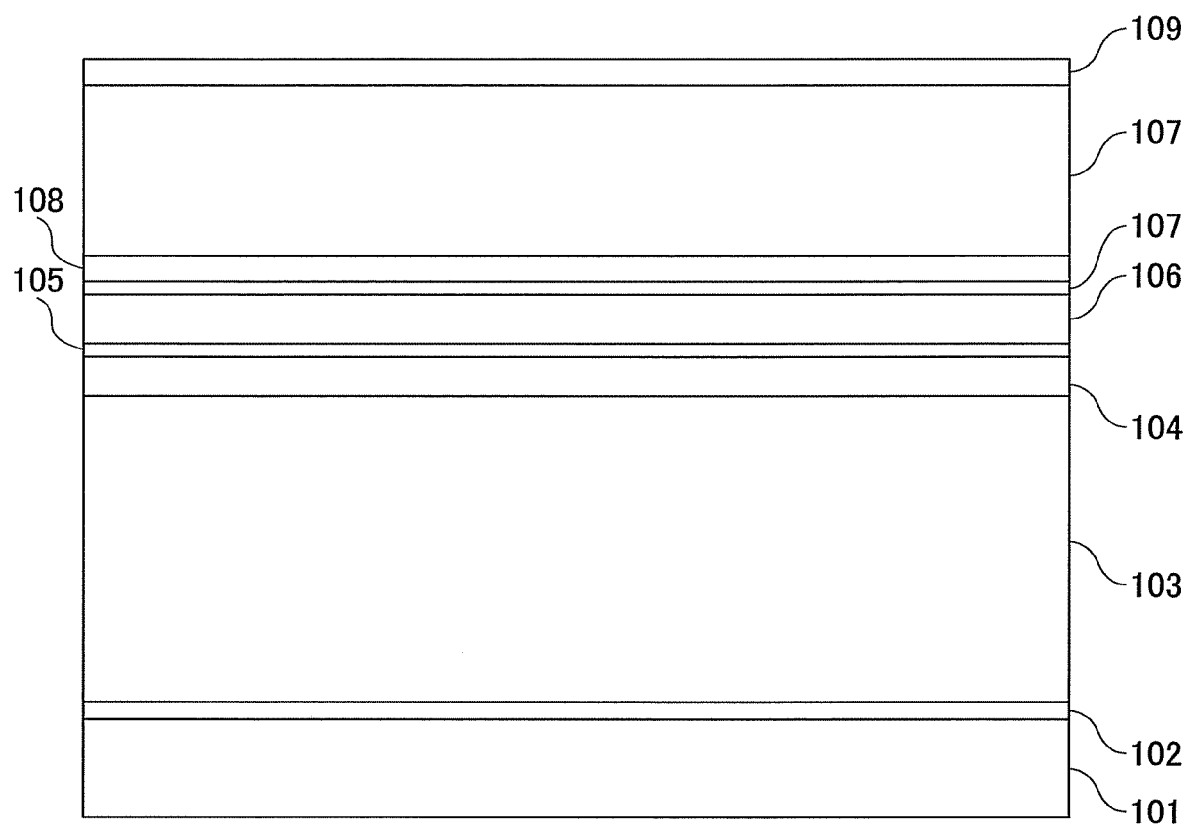
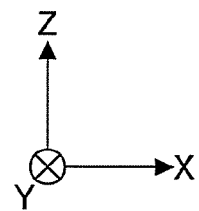

SURFACE-EMITTING LASER ELEMENT, SURFACE-EMITTING LASER ARRAY, OPTICAL SCANNING DEVICE, AND IMAGE FORMING APPARATUS

BACKGROUND OF THE INVENTION

1. Field of the Invention

The present invention relates to surface-emitting laser elements, surface-emitting laser arrays, optical scanning devices, and image forming apparatuses, and more particularly to a surface-emitting laser element, a surface-emitting laser array, an optical scanning device including the surface-emitting laser element or the surface-emitting laser array, and an image forming apparatus including the optical scanning device.

2. Description of the Related Art

A vertical cavity surface-emitting laser element emits light in a direction perpendicular to a substrate. Compared to an edge emitting type semiconductor laser that emits light in a direction parallel to a substrate, the vertical cavity surface-emitting laser element is low price, low power consumption, appropriate for two-dimensional device, and high performance. Therefore, in recent years and continuing, vertical cavity surface-emitting laser elements are attracting attention.

The application areas of vertical cavity surface-emitting laser elements include a light source in an optical wiring system in a printer (oscillation wavelength band: 780 nm), a light source used for writing light in an optical disk device (oscillation wavelength band: 780 nm, 850 nm), and a light source in an optical transmission such as a LAN (Local Area Network) using optical fiber (oscillation wavelength band: 780 nm, 850 nm, 1.3 μm, 1.5 μm). Other expected application areas of vertical cavity surface-emitting laser elements include a light source for optical transmission between boards, inside a board, between chips in a LSI (Large Scale Integrated circuit), and inside chips in an LSI.

In these application areas, the light emitted from the surface-emitting laser element (hereinafter, also referred to as "emission light") is preferably in a single transverse mode and is preferably high output. Particularly, there is demand for light of fundamental transverse-mode oscillation and high output. Accordingly, higher-order transverse mode needs to be prevented, and various attempts have been made to achieve this.

For example, patent document 1 discloses a surface emission semiconductor laser element including the following elements. A layer structure of a semiconductor material, where an emission layer is sandwiched between upper and lower reflector layer structures, is formed on a substrate. An upper electrode having a ring shape in a planar view is located above the upper reflector layer structure. There is an opening on the inside of the electrode. Part of the surface of the opening is coated by a layer that is transparent with respect to the oscillation wavelength of the oscillation laser beam.

Patent document 2 discloses a surface emitting semiconductor laser including the following elements. An active layer has a light emitting center area. A pair of multilayer film reflection mirrors is provided, with the active layer sandwiched therebetween. The multilayer film reflection mirrors have light emitting regions on one side thereof. An electrode has an opening corresponding to the light emitting regions. An insulating film is provided corresponding to the light emitting regions. The insulating film includes a peripheral area surrounding a center area that corresponds to light emission center areas of the light emitting regions. The insulating film is configured such that the reflection ratio of the peripheral area is lower than that of the center area.

Patent document 3 discloses a surface-emitting semiconductor laser including the following elements. A laser structure is formed by laminating the following layers on a substrate. Specifically, a first multilayer film reflection mirror, an active layer having a light emitting center area, a second multilayer film reflection mirror, and a transverse mode adjusting layer are laminated on the substrate in the stated order. Either one of the first multilayer film reflection mirror or the second multilayer film reflection mirror has a current injection area having a quadrangular shape, whose intersection of diagonals corresponds the light emitting center area. The second multilayer film reflection mirror includes a light emission opening provided in an area corresponding to one of the diagonals of the current injection area, and a pair of groove parts having the light emission opening provided therebetween. The transverse mode adjusting layer is provided so as to correspond to the light emission opening. A peripheral area of the light emission opening, which is an area excluding a center area that corresponds to the light emitting center area, has a reflection ratio that is lower than that of the center area.

Patent document 4 discloses a surface-emitting semiconductor laser element including a first multilayer reflection film, an active layer formed on the first multilayer reflection film, and a second multilayer reflection film formed on the active layer. At least one of the first multilayer reflection film or the second multilayer reflection film is positioned in at least part of an area corresponding to the active layer, and has a first region with a thickness of substantially $\lambda/4n$ ($\lambda$: oscillation wavelength, n: refractive index) and a second region disposed on a region other than the first region and that has a thickness other than substantially $\lambda/4n$.

However, in the surface-emitting semiconductor laser disclosed in patent document 3, if the interval between grooves is made narrower than the current narrowed region for specifying the light deflection direction, the current passing region is substantially narrowed. Consequently, the electric resistance of the laser element may increase, or the current density may increase, which shortens the service life of the laser element.

Furthermore, in the surface-emitting semiconductor laser element disclosed in patent document 4, the manufacturing method needs to be performed as follows. That is, crystal growth is performed up to the layer adjacent to the active layer. Then, the crystal growth is interrupted, and resist patterning and film etching is performed. Subsequently, crystal growth needs to be performed once again. In this case, when crystal growth is performed once again, the condition of the surface of the film that has undergone etching affects the crystal growth. Consequently, variations are caused in properties of the laser element and properties of controlling the transverse mode. Accordingly, this method is inappropriate for high-volume production of devices.

Inventors of the present invention performed various experiments and considerations with respect to a structure in which an optically transparent film is formed on a surface, and the transverse mode is controlled by making the center part of a light emitting area have a different reflection ratio from that of a peripheral part of the light emitting area. With such a structure, it has been found that the shape of the low reflection ratio part, particularly variations in the size of the low reflection ratio part, significantly affects the function for preventing the higher-order transverse mode, which may decrease the production yield.

Patent Document 1: Japanese Laid-Open Patent Application No. 2001-156395

Patent Document 2: Japanese Laid-Open Patent Application No. 2006-210429

Patent Document 3: Japanese Laid-Open Patent Application No. 2007-201398

Patent Document 4: Japanese Laid-Open Patent Application No. 2004-289033

SUMMARY OF THE INVENTION

The present invention provides a surface-emitting laser element, a surface-emitting laser array, an optical scanning device, and an image forming apparatus, in which one or more of the above-described disadvantages are eliminated.

A preferred embodiment of the present invention provides a surface-emitting laser element including a substrate; a plurality of semiconductor layers laminated on the substrate, the plural semiconductor layers including a resonator structural body including an active layer and semiconductor multilayer film reflection mirrors having the resonator structural body sandwiched therebetween; an electrode provided in such a manner as to surround an emitting region on a surface of the surface-emitting laser element from which light is emitted; and a dielectric film provided in the emitting region such that a reflection ratio of a peripheral part of the emitting region is different from a reflection ratio of a center part of the emitting region, wherein edge portions that are near edges of the dielectric film are tilted with respect to the surface.

BRIEF DESCRIPTION OF THE DRAWINGS

Other objects, features and advantages of the present invention will become more apparent from the following detailed description when read in conjunction with the accompanying drawings, in which:

FIGS. 6A and 6B are for describing a method of manufacturing the surface-emitting laser element according to the first embodiment of the present invention (part 1);

DETAILED DESCRIPTION OF THE PREFERRED EMBODIMENTS

A description is given, with reference to the accompanying drawings, of embodiments of the present invention.

Figure 1:
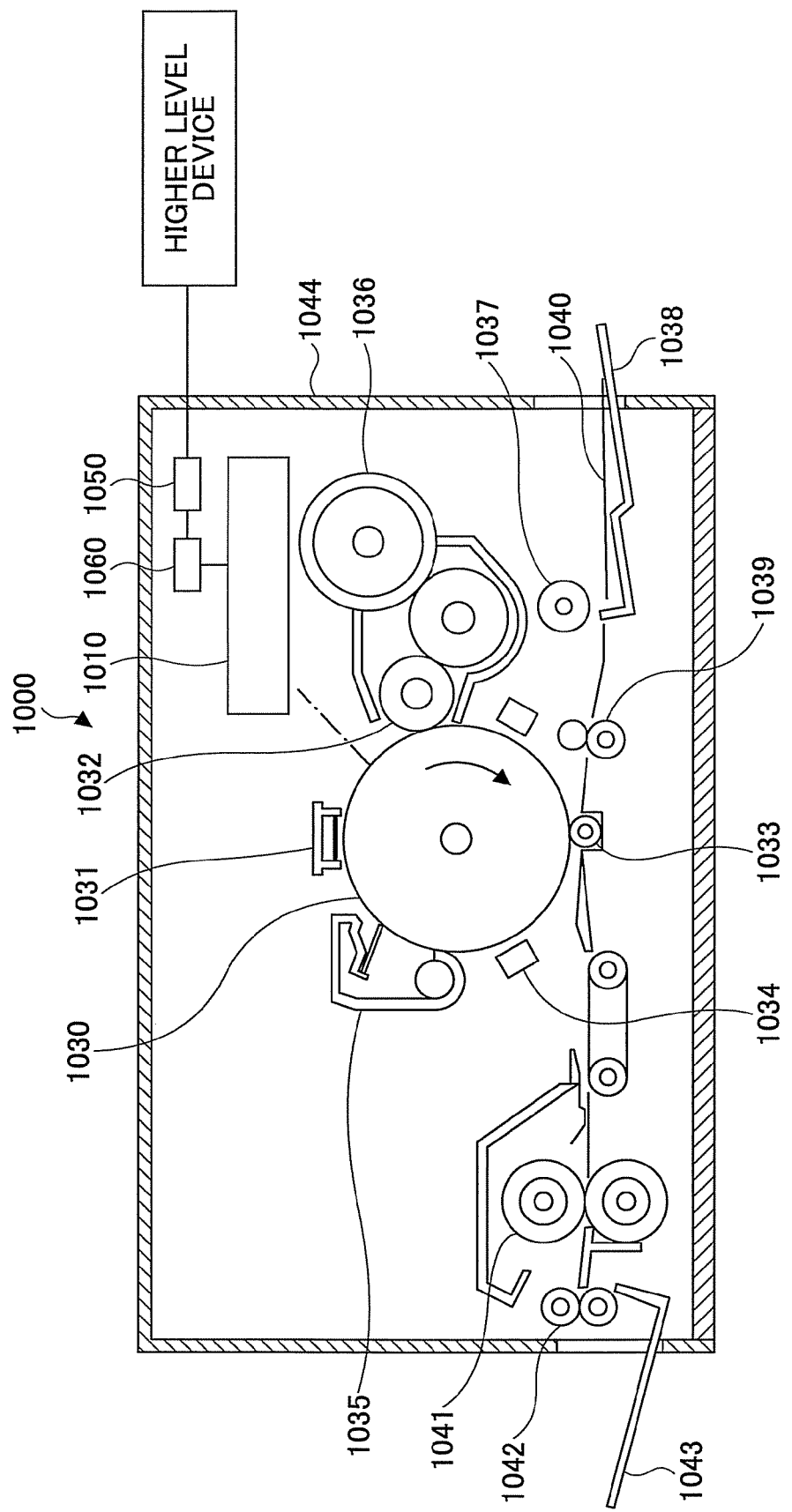
FIG. 1 is a schematic diagram of a laser printer according to an embodiment of the present invention.

FIG. 1 is a schematic diagram of a laser printer 1000 according to an embodiment of the present invention.

The laser printer 1000 includes an optical scanning device 1010, a photoconductive drum 1030, a charging unit 1031, a developing roller 1032, a transfer charger 1033, a discharging unit 1034, a cleaning unit 1035, a toner cartridge 1036, a sheet feeding roller 1037, a sheet feeding tray 1038, a pair of resist rollers 1039, a fixing roller 1041, a sheet eject roller 1042, a sheet eject tray 1043, a communications control device 1050, and a printer control device 1060 that is an integrated controller of the above elements. These elements are accommodated at predetermined positions in a printer housing 1044.

The communications control device 1050 controls bidirectional communications between the laser printer 1000 and a higher-level device (for example, a personal computer) via a network.

The photoconductive drum 1030 is a cylindrical member having a photoconductive layer formed on its surface. That is to say, the surface of the photoconductive drum 1030 is the target of scanning operations (scan target surface). Furthermore, the photoconductive drum 1030 is configured to rotate in a direction indicated by an arrow in FIG. 1.

The charging unit 1031, the developing roller 1032, the transfer charger 1033, the discharging unit 1034, and the cleaning unit 1035 are located near the surface of the photoconductive drum 1030. Specifically, these elements are positioned in the order of the charging unit 1031→the developing roller 1032→the transfer charger 1033→the discharging unit 1034→the cleaning unit 1035, along the rotation direction of the photoconductive drum 1030.

The charging unit 1031 uniformly charges the surface of the photoconductive drum 1030.

The optical scanning device 1010 scans the surface of the photoconductive drum 1030 that has been charged by the charging unit 1031, with light beams modulated based on image information received from the higher-level device. Accordingly, a latent image corresponding to the image information is formed on the surface of the photoconductive drum 1030. The formed latent image moves toward the developing roller 1032 in accordance with the rotation of the photoconductive drum 1030. The configuration of the optical scanning device 1010 is described below.

The toner cartridge 1036 stores toner, and the toner is supplied to the developing roller 1032.

The developing roller 1032 develops an image corresponding to the image information, by causing the toner supplied from the toner cartridge 1036 to adhere to the latent image formed on the surface of the photoconductive drum 1030. The latent image on which toner has adhered (hereinafter, also referred to as "toner image") moves toward the transfer charger 1033 in accordance with the rotation of the photoconductive drum 1030.

The sheet feeding tray 1038 accommodates recording sheets 1040. The sheet feeding roller 1037 is located near the sheet feeding tray 1038. The sheet feeding roller 1037 retrieves one recording sheet 1040 at a time from the sheet feeding tray 1038, and conveys the retrieved recording sheet 1040 to the pair of resist rollers 1039. The pair of resist rollers 1039 temporarily holds the recording sheet 1040 retrieved by the sheet feeding roller 1037, and then sends out the recording sheet 1040 into a gap between the photoconductive drum 1030 and the transfer charger 1033 in synchronization with the rotation of the photoconductive drum 1030.

A voltage of an opposite polarity to that of toner is applied to the transfer charger 1033, so that the toner on the surface of the photoconductive drum 1030 is electrically attracted to the recording sheet 1040. Due to this voltage, the toner image on the surface of the photoconductive drum 1030 is transferred to the recording sheet 1040. The recording sheet 1040 on which the toner image has been transferred is then sent to the fixing roller 1041.

At the fixing roller 1041, heat and pressure are applied to the recording sheet 1040, so that the toner is fixed onto the recording sheet 1040. The recording sheet 1040 onto which the toner has been fixed is then sent to the sheet eject tray 1043 via the sheet eject roller 1042. The recording sheets 1040 are sequentially stacked on the sheet eject tray 1043.

The discharging unit 1034 discharges the surface of the photoconductive drum 1030.

The cleaning unit 1035 removes the toner (residual toner) remaining on the surface of the photoconductive drum 1030. The part of the surface of the photoconductive drum 1030, from which the residual toner has been removed, returns to the position facing the charging unit 1031.

Next, a description is given of the optical scanning device 1010.

Figure 2:
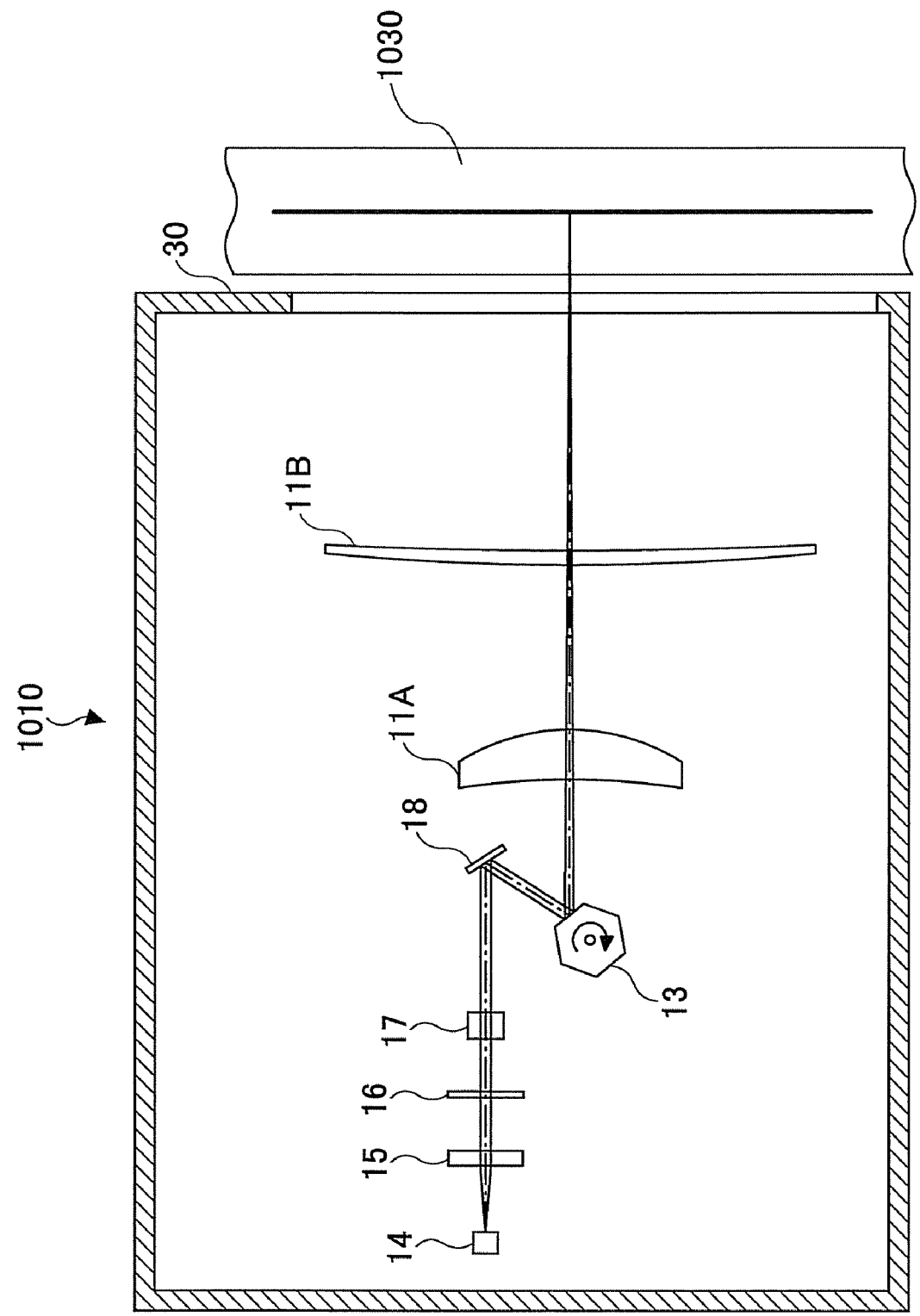
FIG. 2 is a schematic diagram of an optical scanning device illustrated in FIG. 1.

As shown in the example of FIG. 2, the optical scanning device 1010 includes a deflector side scanning lens 11A, an image face side scanning lens 11B, a polygon mirror 13, a light source 14, a coupling lens 15, an opening plate 16, a cylindrical lens 17, a reflection mirror 18, and a scan control device (not shown). These elements are situated at predetermined positions in an optical housing 30.

In the following description, a direction corresponding to the main scanning direction is referred to as a "main scanning corresponding direction", and a direction corresponding to the sub scanning direction is referred to as a "sub scanning corresponding direction".

The coupling lens 15 turns the light beams output from the light source 14 into substantially parallel light beams.

The opening plate 16 has an opening, and adjusts the light beams received via the coupling lens 15.

The cylindrical lens 17 focuses the light beams that have passed though the opening of the opening plate 16, near the deflective reflection surface of the polygon mirror 13 via the reflection mirror 18, in the sub scanning corresponding direction.

The optical system positioned along the light path between the light source 14 and the polygon mirror 13 is also referred to as a pre-deflector optical system. In the present embodiment, the pre-deflector optical system includes the coupling lens 15, the opening plate 16, the cylindrical lens 17, and the reflection mirror 18.

For example, the polygon mirror 13 includes a hexagonal polygon mirror with six mirror surfaces, whose inscribed circle has a radius of 18 mm. The six mirror surfaces correspond to deflective reflection surfaces. The polygon mirror 13 rotates at a constant speed around an axis parallel to the Z axis direction, and deflects the light beams from the reflection mirror 18.

The deflector side scanning lens 11A is arranged on a light path of light beams deflected by the polygon mirror 13.

The image face side scanning lens 11B is arranged on a light path of light beams that have passed through the deflector side scanning lens 11A. The light beams that have passed through the image face side scanning lens 11B are emitted onto the surface of the photoconductive drum 1030, and a light spot is formed on the surface of the photoconductive drum 1030. The light spot moves in the longitudinal direction of the photoconductive drum 1030 as the polygon mirror 13 rotates. That is to say, the light spot scans the surface of the photoconductive drum 1030. The direction in which the light spot moves in this operation is referred to as the "main scanning direction". The direction in which the photoconductive drum 1030 rotates in this operation is referred to as the "sub scanning direction".

The optical system that is arranged on the light path between the polygon mirror 13 and the photoconductive drum 1030 is also referred to as a scanning optical system. In the present embodiment, the scanning optical system includes the deflector side scanning lens 11A and the image face side scanning lens 11B. At least one turn-back mirror may be arranged on at least one of the light path extending between the deflector side scanning lens 11A and the image face side scanning lens 11B, and the light path extending between the image face side scanning lens 11B and the photoconductive drum 1030.

The light source 14 includes a vertical cavity type surface-emitting laser element that emits laser beams in a direction perpendicular to a substrate. The surface-emitting laser element may have various configurations and structures. In the following, five embodiments (first embodiment through fifth embodiment) are described. It is assumed that each surface-emitting laser element has an oscillation wavelength band of 780 nm.

In the description of the present application, in an XYZ three-dimensional orthogonal coordinate system, the Z axis direction is the direction extending along the laser oscillation direction, and the X axis direction and the Y axis direction are two directions that are orthogonal to each other within a plane perpendicular to the Z axis direction. <

First Embodiment: Surface-Emitting Laser Element 100A>

Figure 3:
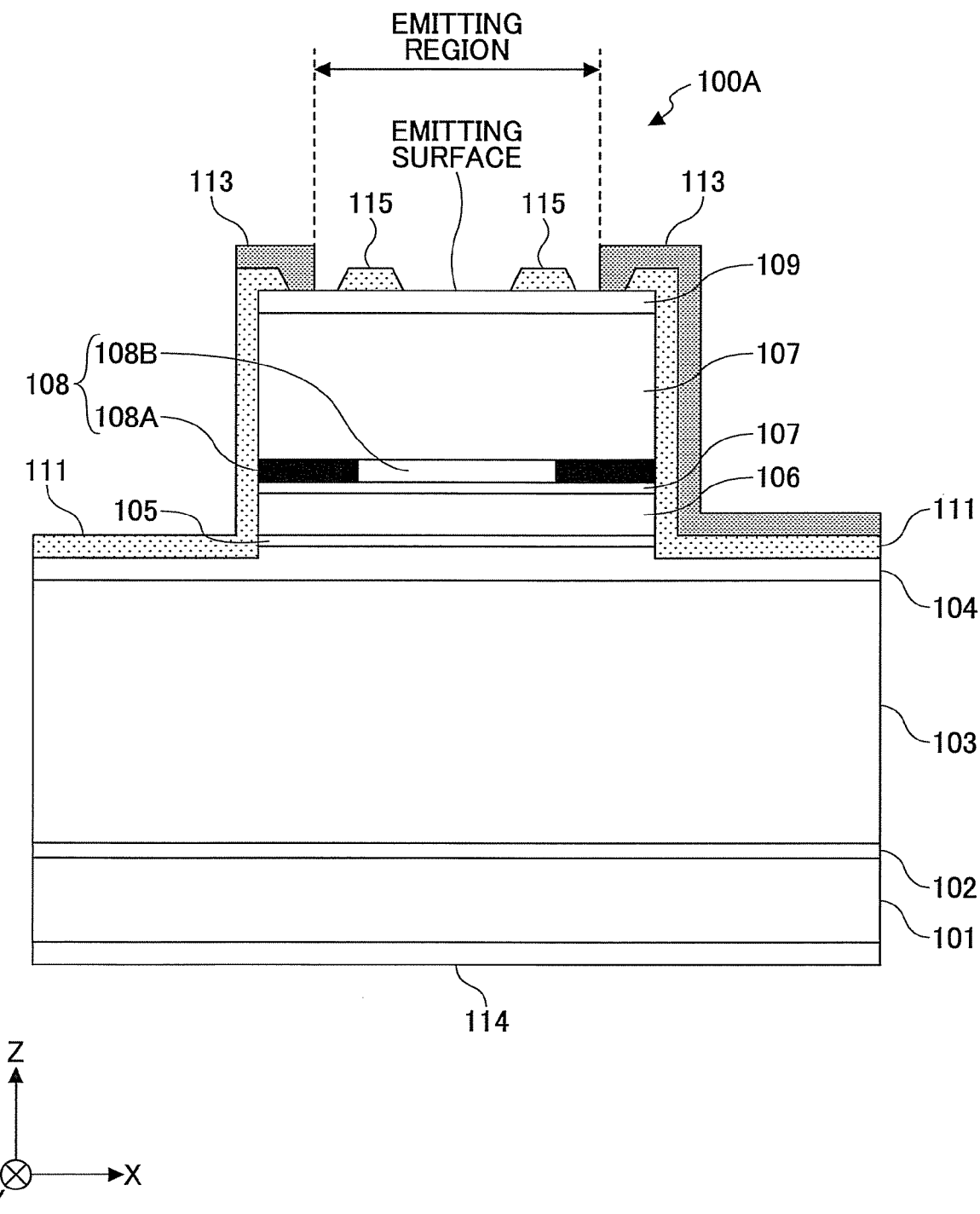
FIG. 3 is for describing a surface-emitting laser element according to a first embodiment of the present invention.
Figure 4:
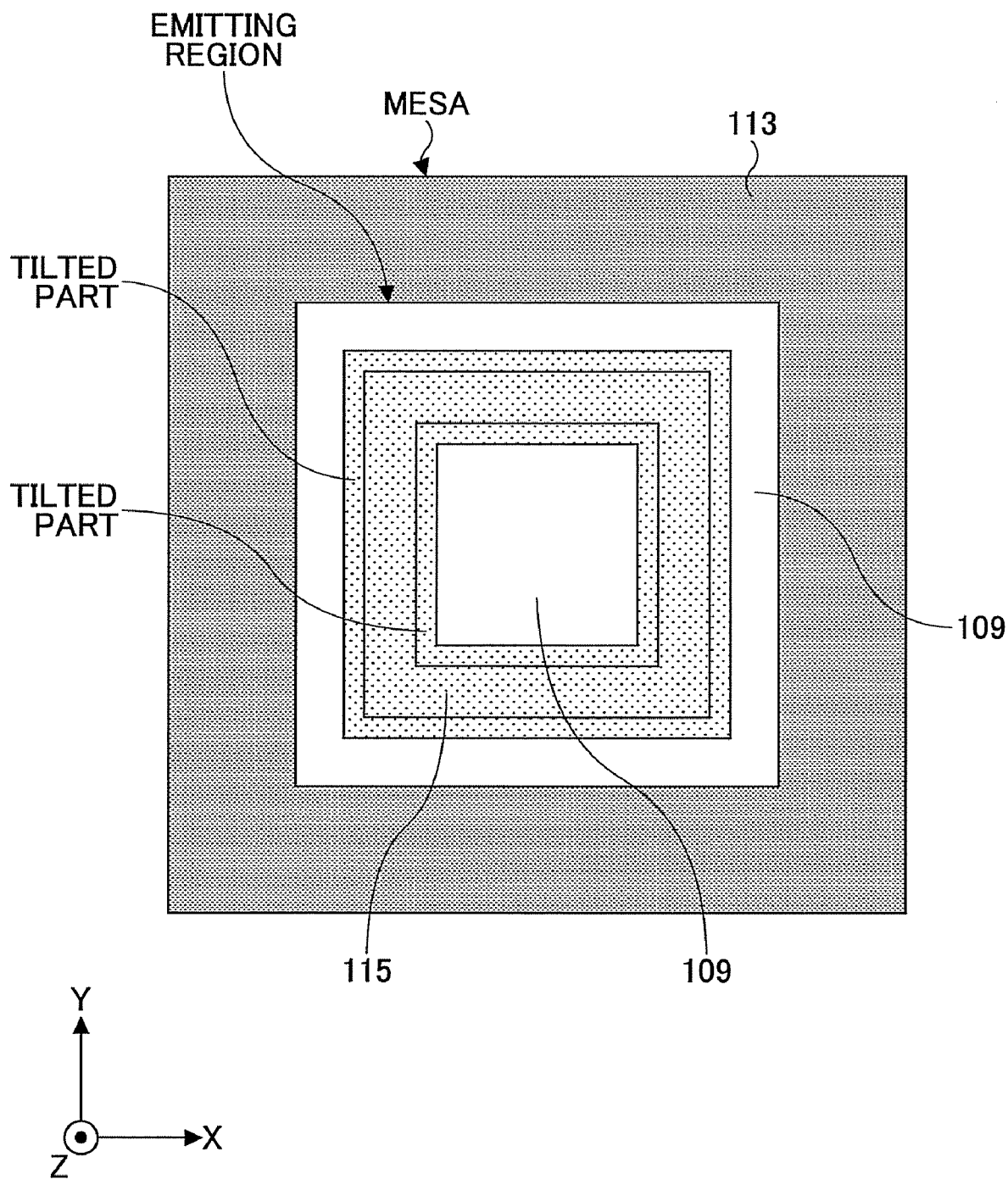
FIG. 4 is an enlarged plan view of the top surface of the mesa of the surface-emitting laser element according to the first embodiment of the present invention in FIG. 3.

As illustrated in FIGS. 3 and 4, a surface-emitting laser element 100A includes a substrate 101, a buffer layer 102, a lower semiconductor DBR 103, a lower spacer layer 104, an active layer 105, an upper spacer layer 106, an upper semiconductor DBR 107, a contact layer 109, a p-side electrode 113, an n-side electrode 114, and a mode filter 115. FIG. 3 is a cross-sectional view of the surface-emitting laser element 100A parallel to the XZ plane. FIG. 4 is an enlarged plan view of the emitting surface part of FIG. 3.

Figure 5A:
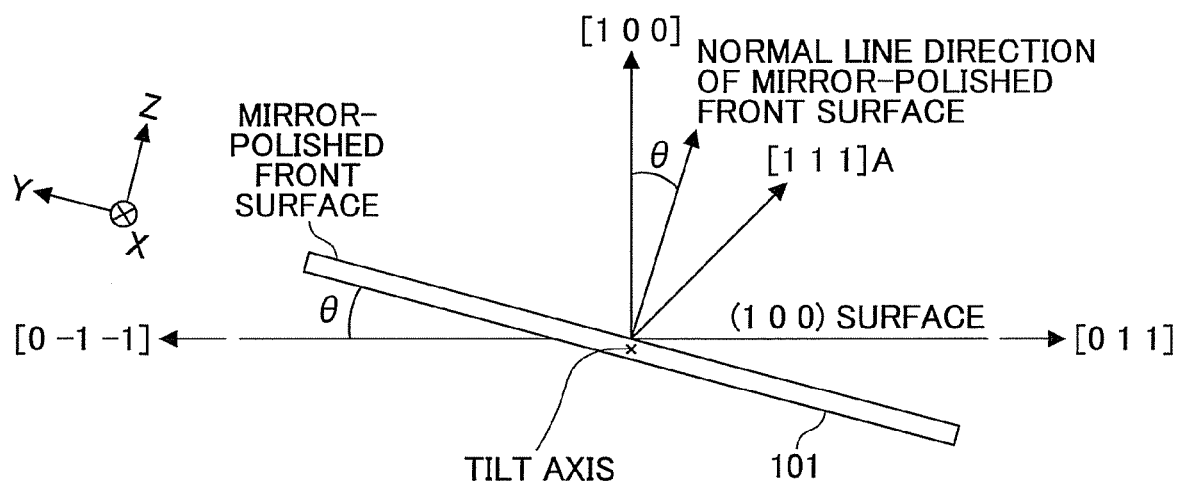
FIGS. 5A and 5B are for describing a tilted substrate.
Figure 5B:
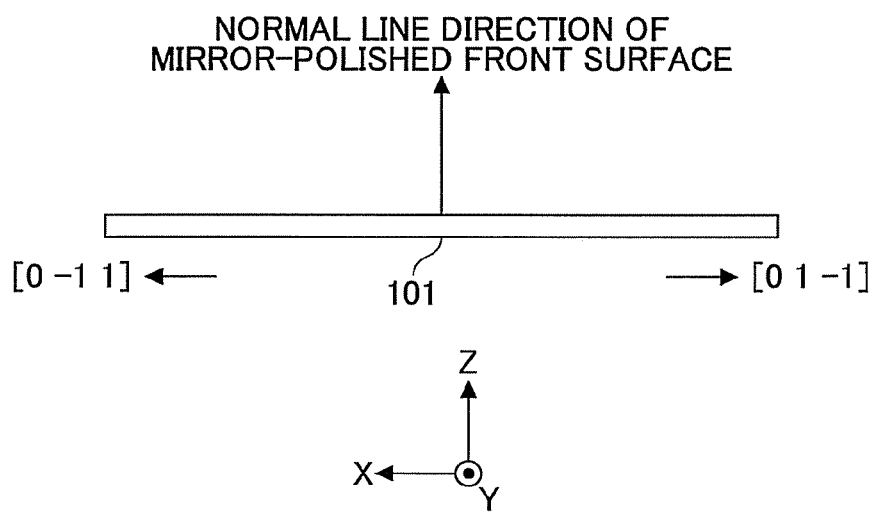

The substrate 101 has a mirror-polished front surface. As shown in FIG. 5A, the substrate 101 is an n-GaAs single-crystal substrate, in which the normal line direction of the mirror-polished surface (main surface) is tilted by 15 degrees ($\theta$=15 degrees) toward a crystal orientation [1 1 1]A direction from a crystal orientation [1 0 0] direction. Thus, the substrate 101 is a so-called tilted substrate. In this example, as shown in FIG. 5B, the substrate 101 is arranged such that the crystal orientation [0 -1 1] direction is the +X direction, and the crystal orientation [0 1 -1] direction is the -X direction.

Referring back to FIG. 3, the buffer layer 102 is laminated on the +Z side surface of the substrate 101, and is made of n-GaAs.

The lower semiconductor DBR 103 is laminated on the +Z side of the buffer layer 102, and includes 40.5 pairs of low refractive index layers and high refractive index layers. The low refractive index layers are made of n-AlAs and the high refractive index layers are made of n-$Al_{0.3}Ga_{0.7}As$. Between the refractive index layers, composition graded layers having a thickness of 20 nm are provided for the purpose of reducing electric resistance. In the composition graded layer, the composition gradually changes from one composition to another composition. Each refractive index layer is set to have an optical thickness of $\lambda/4$, assuming that the oscillation wavelength is $\lambda$, including half of adjacent composition graded layers. When the optical thickness is $\lambda/4$, the actual thickness D of the layer is D=$\lambda/4n$ (where n is the refractive index of the medium of the corresponding layer).

The lower spacer layer 104 is laminated on the +Z side of the lower semiconductor DBR 103, and is made of nondoped $(Al_{0.1}Ga_{0.9})_{0.5}In_{0.5}P$.

The active layer 105 is laminated on the +Z side of the lower spacer layer 104, and is an active layer having a three-quantum-well structure of GaInAsP/GaInP. Each of the quantum-well layers is made of GaInAsP, which is a composition that induces a compression strain of 0.7%. Each of the barrier layers is made of GaInP, which is a composition that induces a tensile strain of 0.6%.

The upper spacer layer 106 is laminated on the +Z side of the active layer 105, and is made of nondoped $(Al_{0.1}Ga_{0.9})_{0.5}In_{0.5}P$.

The part including the lower spacer layer 104, the active layer 105, and the upper spacer layer 106 is referred to as a resonator structural body, having a thickness that corresponds to an optical thickness of one wavelength. The active layer 105 is positioned at the center of the resonator structural body, which corresponds to the antinode of the stationary wave distribution of the electric field, so that high stimulated emission probability is achieved.

The upper semiconductor DBR 107 is laminated on the +Z side of the upper spacer layer 106, and includes 23 pairs of low refractive index layers and high refractive index layers. The low refractive index layers are made of p-$Al_{0.9}Ga_{0.1}As$, and the high refractive index layers are made of p-$Al_{0.3}Ga_{0.7}As$. Between the refractive index layers, composition graded layers are provided for the purpose of reducing electric resistance. In the composition graded layer, the composition gradually changes from one composition to another composition. Each refractive index layer is set to have an optical thickness of $\lambda/4$, including half of adjacent composition graded layers.

As one of the low refractive index layers of the upper semiconductor DBR 107, a selective oxidation layer 108 made of p-AlAs having a thickness of 30 nm is inserted. The position of inserting the selective oxidation layer 108 corresponds to the third node from the active layer 105.

The contact layer 109 is laminated on the +Z side of the upper semiconductor DBR 107, and is made of p-GaAs.

The mode filter 115 is a dielectric film that is formed on the +Z side of the contact layer 109 within an emitting region. For example, the mode filter 115 surrounds the center part of the emitting region, and the reflection ratio of the mode filter 115 is lower than that of the center part of the emitting region.

Next, a brief description is given of a method of manufacturing the surface-emitting laser element 100A. A body with plural semiconductor layers being laminated on the substrate 101 as described above is referred to as a "lamination body", as a matter of convenience.

(1) The lamination body is created by crystal growth according to a Metal Organic Chemical Vapor Deposition method (MOCVD method) or a Molecular Beam Epitaxy method (MBE method) (see FIG. 6A).

In the case of the MOCVD method, trimethylaluminum (TMA), trimethylgallium (TMG), and trimethylindium (TMI) are used as raw materials of group-III; and phosphine ($PH_3$) and arsine ($AsH_3$) are used as raw materials of group-V. Furthermore, carbon tetrabromide ($CBr_4$) and dimethylzinc (DMZn) are used as raw materials of p-type dopant; and hydrogen selenide ($H_2Se$) is used as raw materials of n-type dopant.

(2) A resist pattern having a square shape with sides of 25 µm is formed on the surface of the lamination body.

(3) An ECR etching method is performed to form a mesa structural body (hereinafter, simply referred to as "mesa" as a matter of convenience) that is a square pole, with the use of C12 gas and the above resist pattern as a photomask. In this example, the bottom sides of etched parts are positioned in the lower spacer layer 104.

Figure 6B:
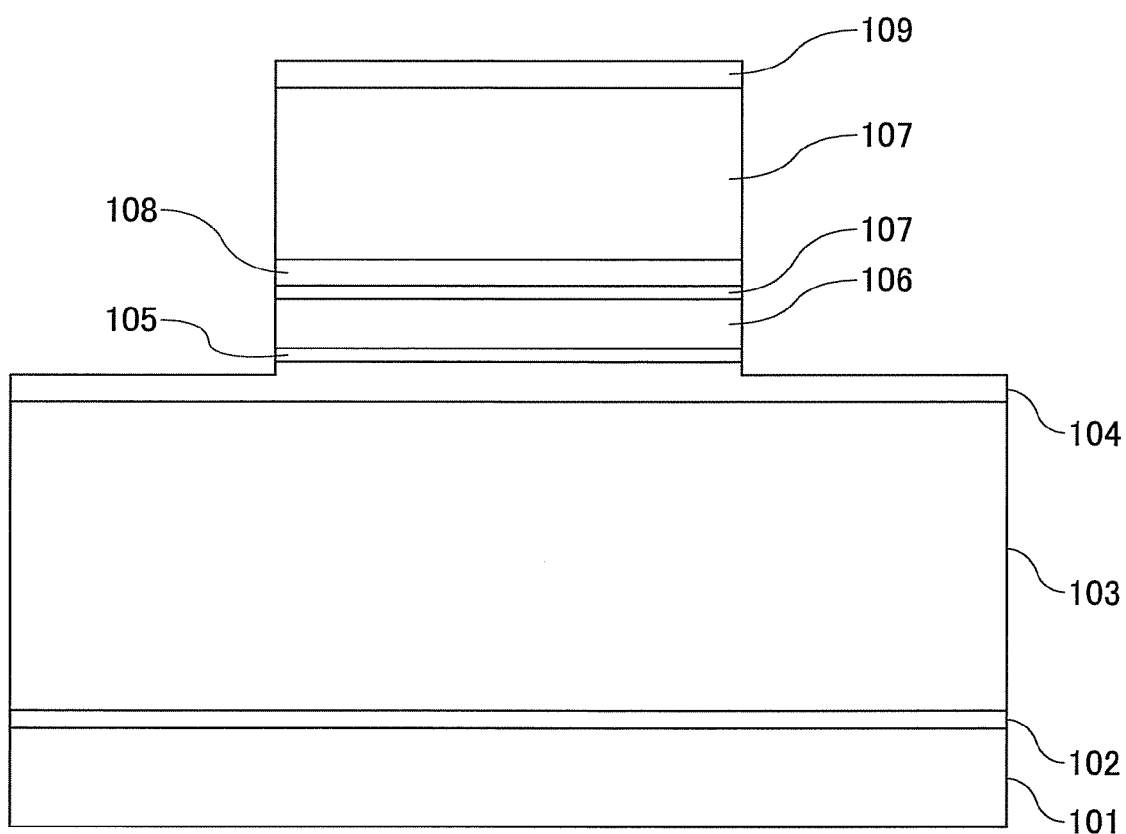

(4) The photomask is removed (see FIG. 6B).

(5) The lamination body is heat-treated in water vapor. Accordingly, the Al (Aluminum) in the selective oxidation layer 108 is selectively oxidized from the outer periphery of the mesa. Accordingly, at the center part of the mesa, there remains an area 108B that is not oxidized and surrounded by an oxidation layer 108A of Al. That is to say, the path of a driving current for the light emitting unit is limited to the center part of the mesa. Consequently, an oxidized narrowed structural body is formed. The area 108B that is not oxidized corresponds to a current passing area (current injection area). Accordingly, a current passing area having a substantially square shape with a width of, for example, approximately 4 µm through 6 µm is formed.

Figure 7A:
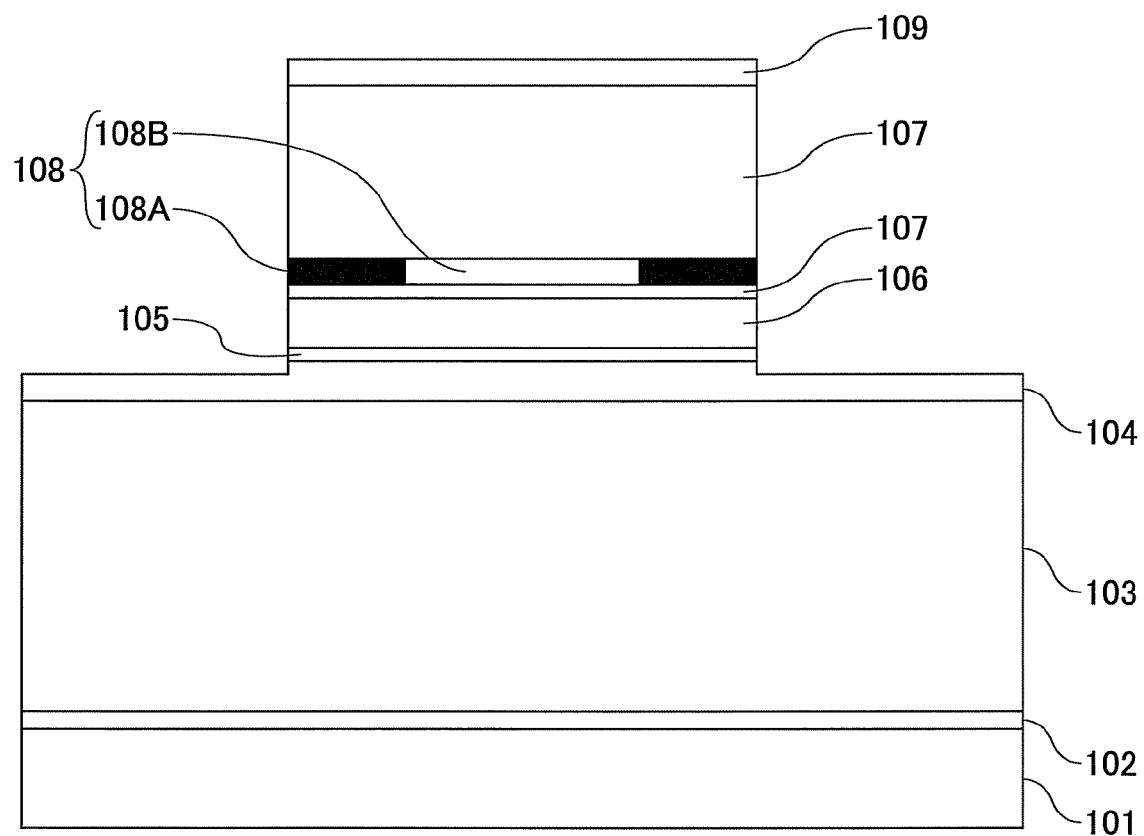
FIGS. 7A and 7B are for describing the method of manufacturing the surface-emitting laser element according to the first embodiment of the present invention (part 2)
Figure 7B:
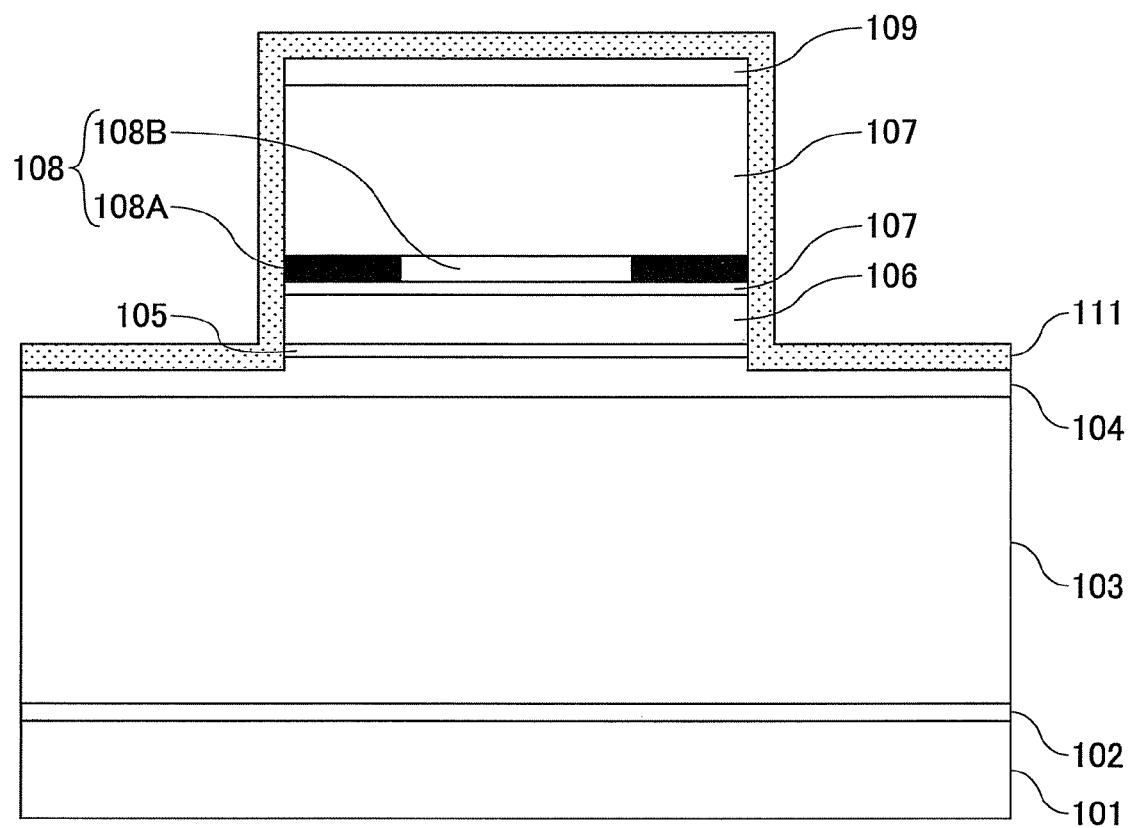

(6) A protection layer 111 made of SiN is formed by a chemical vapor deposition method (CVD method) (see FIG. 7B). In this example, the protection layer 111 has an optical thickness of $\lambda/4$. Specifically, the refractive index n of Sin is 1.86 and the oscillation wavelength $\lambda$ is 780 nm, and therefore the actual film thickness ($=\lambda/4n$) is set at approximately 105 nm. Conditions of forming the SiNx film are as follows. In an atmosphere with a $SH_4$ gas flow rate of 5 sccm, a $NH_3$ gas flow rate of 5 sccm, a $N_2$ gas flow rate of 190 sccm, and an air pressure of 70 Pa, RF power of 135 W is applied to an electrode having a diameter of 12 inches to attain a plasma state. The substrate temperature is set at 275° C., so that a soluble SiNx film is formed on buffered hydrofluoric acid (BHF) by an etching speed of 60 nm/minute through 70 nm/minute.

Figure 8:
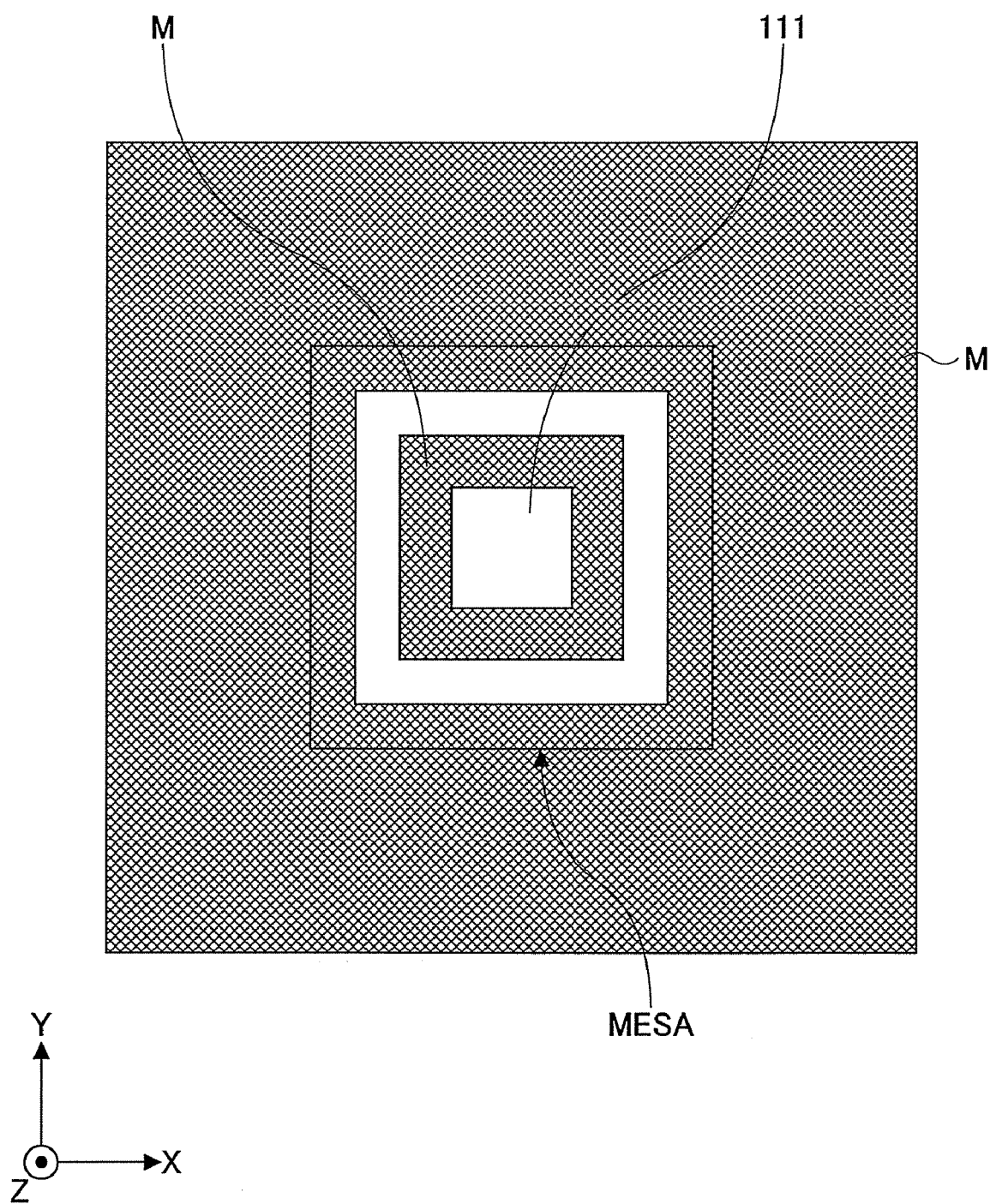
FIG. 8 is for describing an etching mask.
Figure 9:
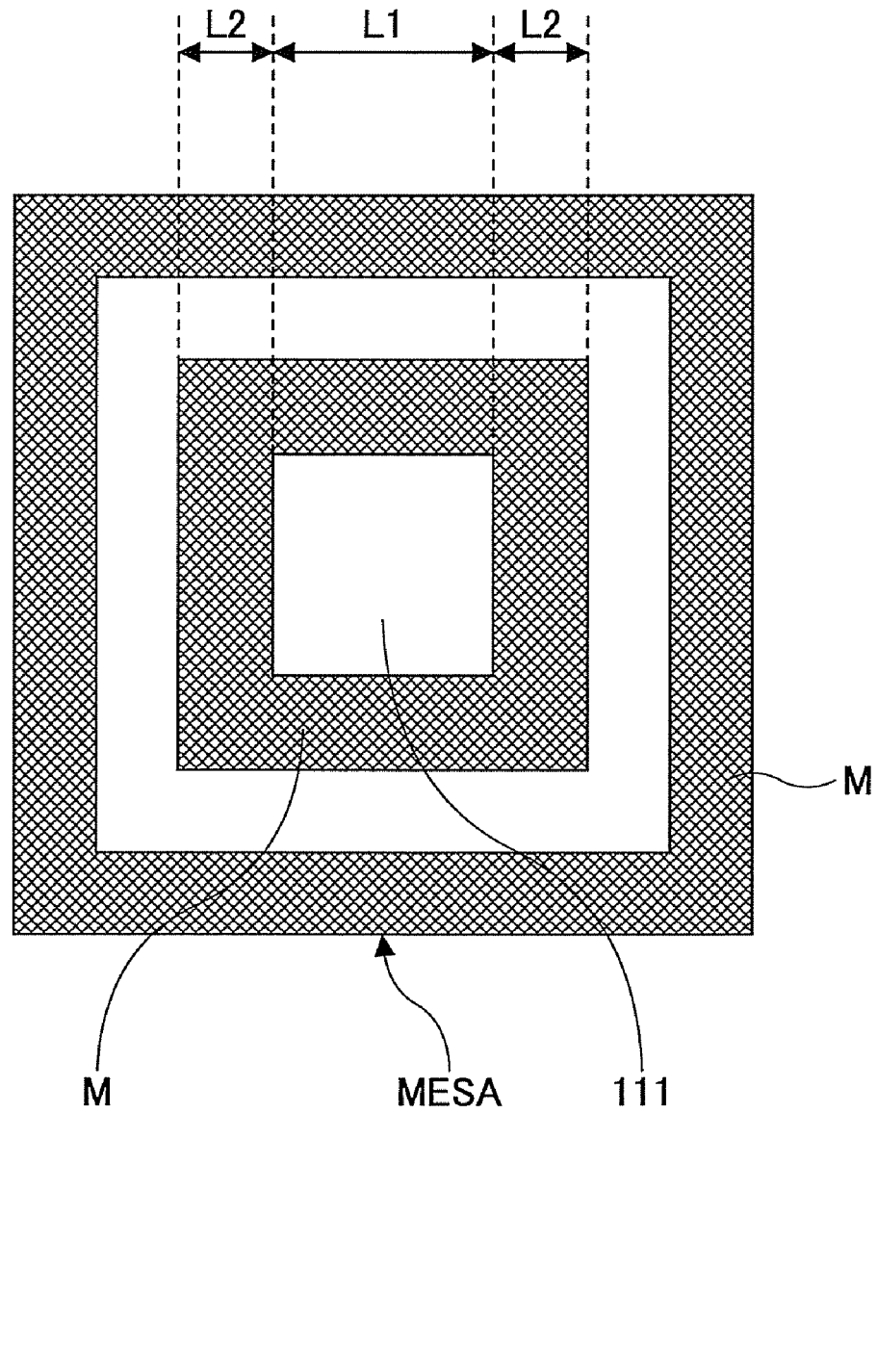
FIG. 9 is an enlarged plan view of the top surface of the mesa in FIG. 8.

(7) On the top surface of the mesa, which acts as the laser emitting surface, an etching mask (mask M) is formed for opening a window for p-side electrode contact. As shown in FIG. 8, a mask M is formed so that the area where the mode filter 115 is to be formed, the part around the mesa, and the outer periphery of the top surface of the mesa are not etched. FIG. 9 is an enlarged view of the top surface of the mesa in FIG. 8. For example, in FIG. 9, L1 is 3.7 µm, and L2 is 2 µm.

(8) The protection layer 111 is wet etched, and the window is opened for contacting the p-side electrode. Specific processes are described below.

(8-1) The protection layer 111 is impregnated in buffered hydrofluoric acid (BHF) with a density of 1% including a surface active agent, for 110 seconds. The speed of etching the SiNx film is 60 nm/minute through 70 nm/minute, and therefore the parts to be etched can be completely removed within 110 seconds.

(8-2) The protection layer 111 is impregnated in pure water for two seconds.

(8-3) The protection layer 111 is maintained in running pure water for 300 seconds.

(8-4) The protection layer 111 is subjected to spin drying.

Figure 10A:
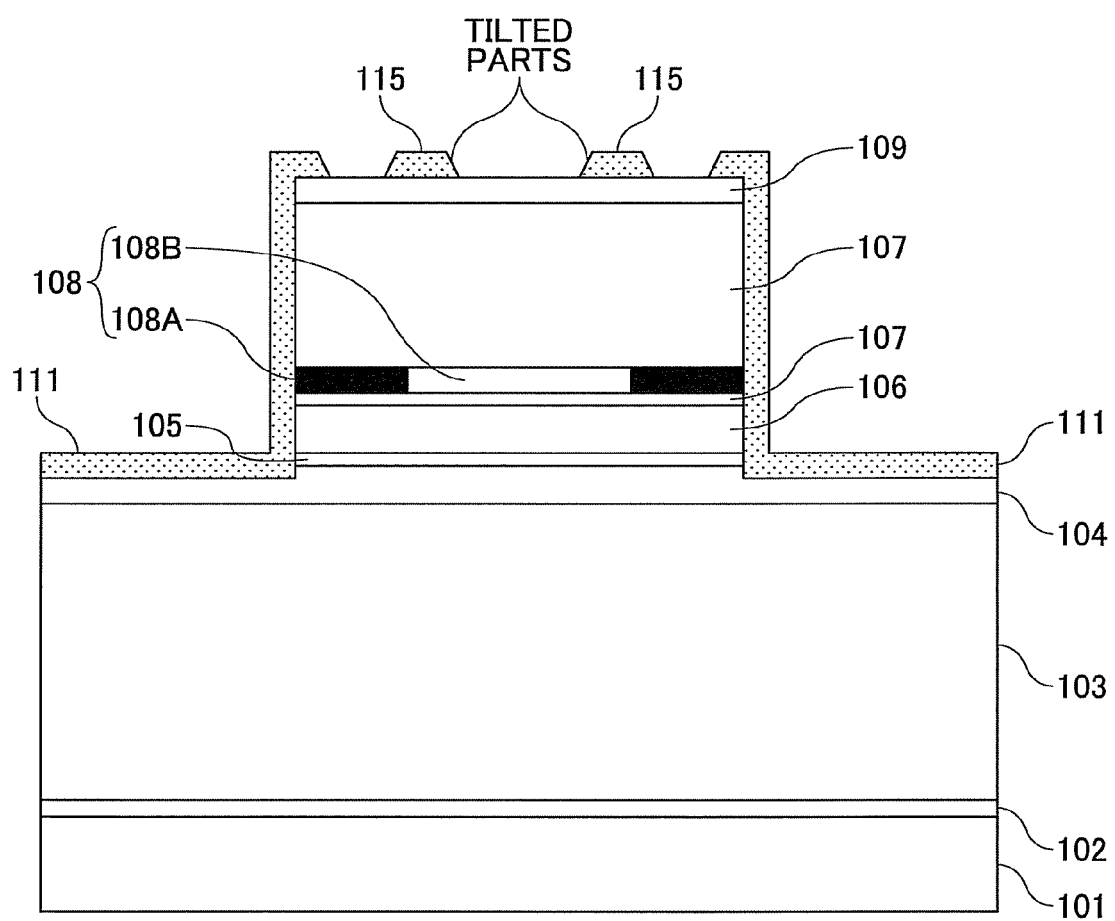
FIG. 10A is for describing the method of manufacturing the surface-emitting laser element according to the first embodiment of the present invention (part 3)
Figure 10B:
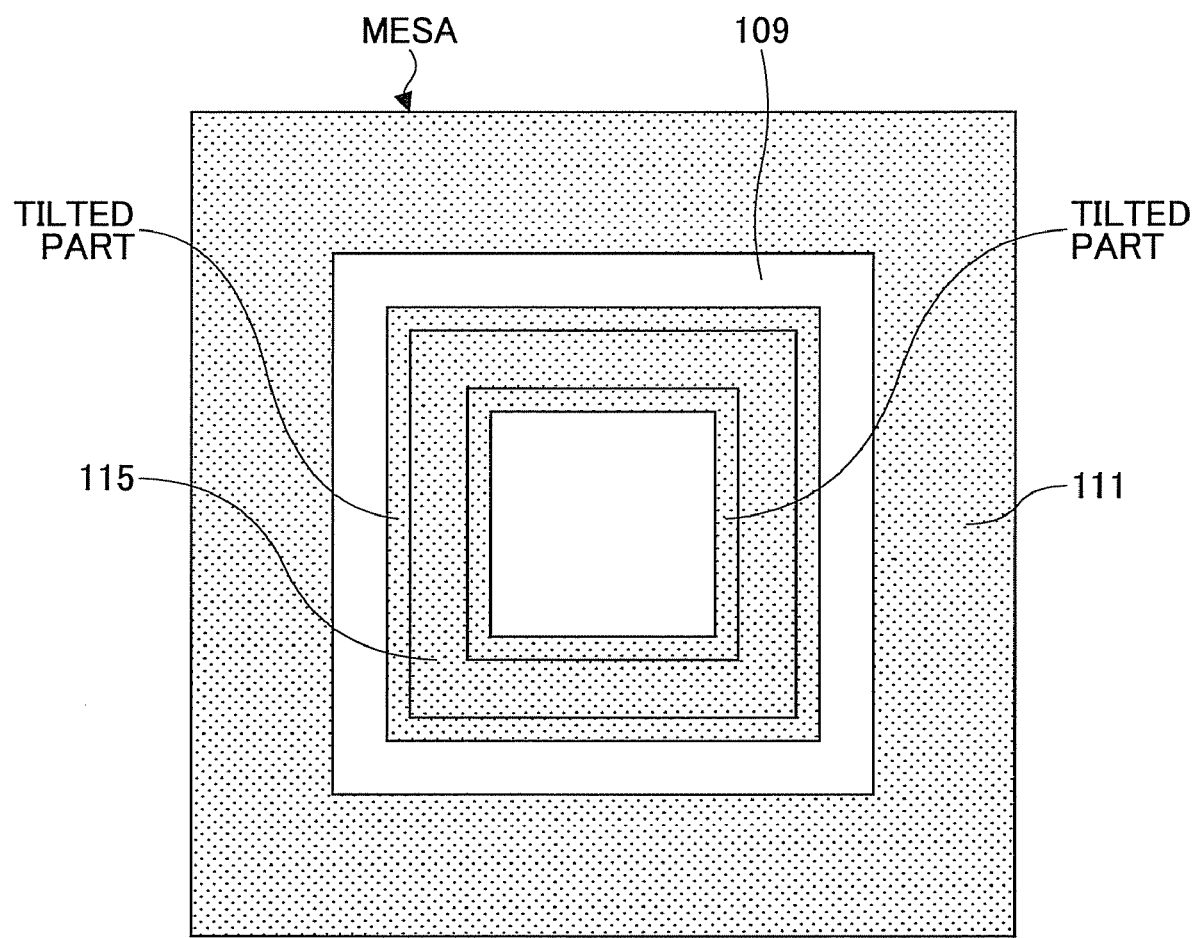
FIG. 10B is an enlarged plan view of the top surface of the mesa in FIG. 10A.

(9) The mask M is removed (see FIGS. 10A and 10B). The protection layer 111 remaining in the emitting region has a trapezoid shape as viewed in an XZ cross-section. That is to say, the protection layer 111 remaining in the emitting region includes a part having a top surface that is parallel to the XY surface and that has an optical thickness of $\lambda/4$ (hereinafter, also referred to as a "flat part"), and a part having a top surface that is tilted with respect to the XY plane and that has an optical thickness that gradually decreases from $\lambda/4$ to zero (hereinafter, also referred to as a "tilted part").

The flat part of the protection layer 111 remaining in the emitting region becomes the mode filter 115. The surface of the tilted part is tilted at an angle of 15 degrees with respect to the emitting surface. By forming the protection layer 111 by wet etching, the mode filter 115 can be tilted with respect to the XY plane. By performing the wet etching at a speed of 60 nm/minute through 70 nm/minute, the tilted part can be tilted at an angle of 15 degrees. By controlling the wet etching speed of the SiNx film, the time duration of the process at (8-1) can be changed, and the tilt angle can be an angle other than 15 degrees.

(10) A resist pattern having a square shape with sides of 10 µm is formed on the top surface of the mesa, and p-side electrode material is vapor deposited. The p-side electrode material may be a multilayer film made of Cr/AuZn/Au or a multilayer film made of Ti/Pt/Au.

Figure 11:
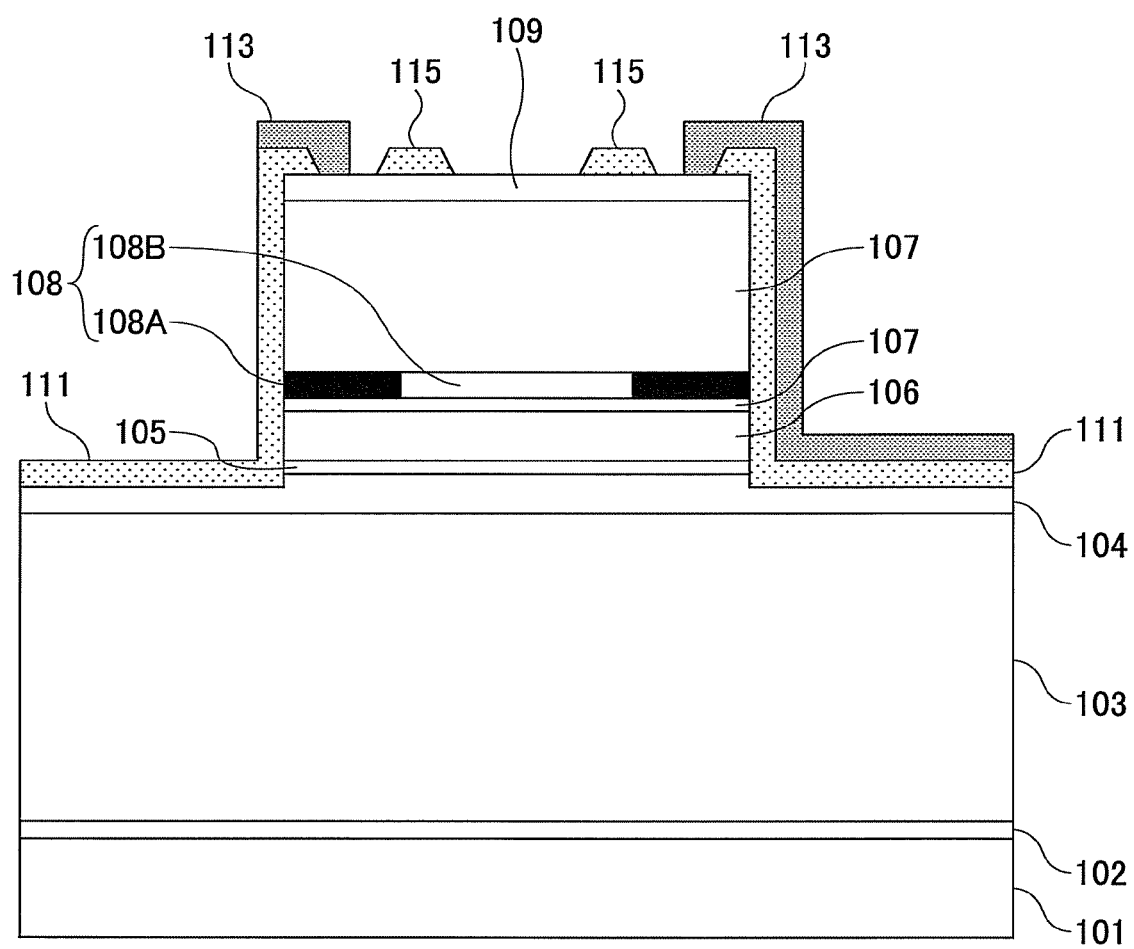
FIG. 11 is for describing the method of manufacturing the surface-emitting laser element according to the first embodiment of the present invention (part 4)
Figure 12:
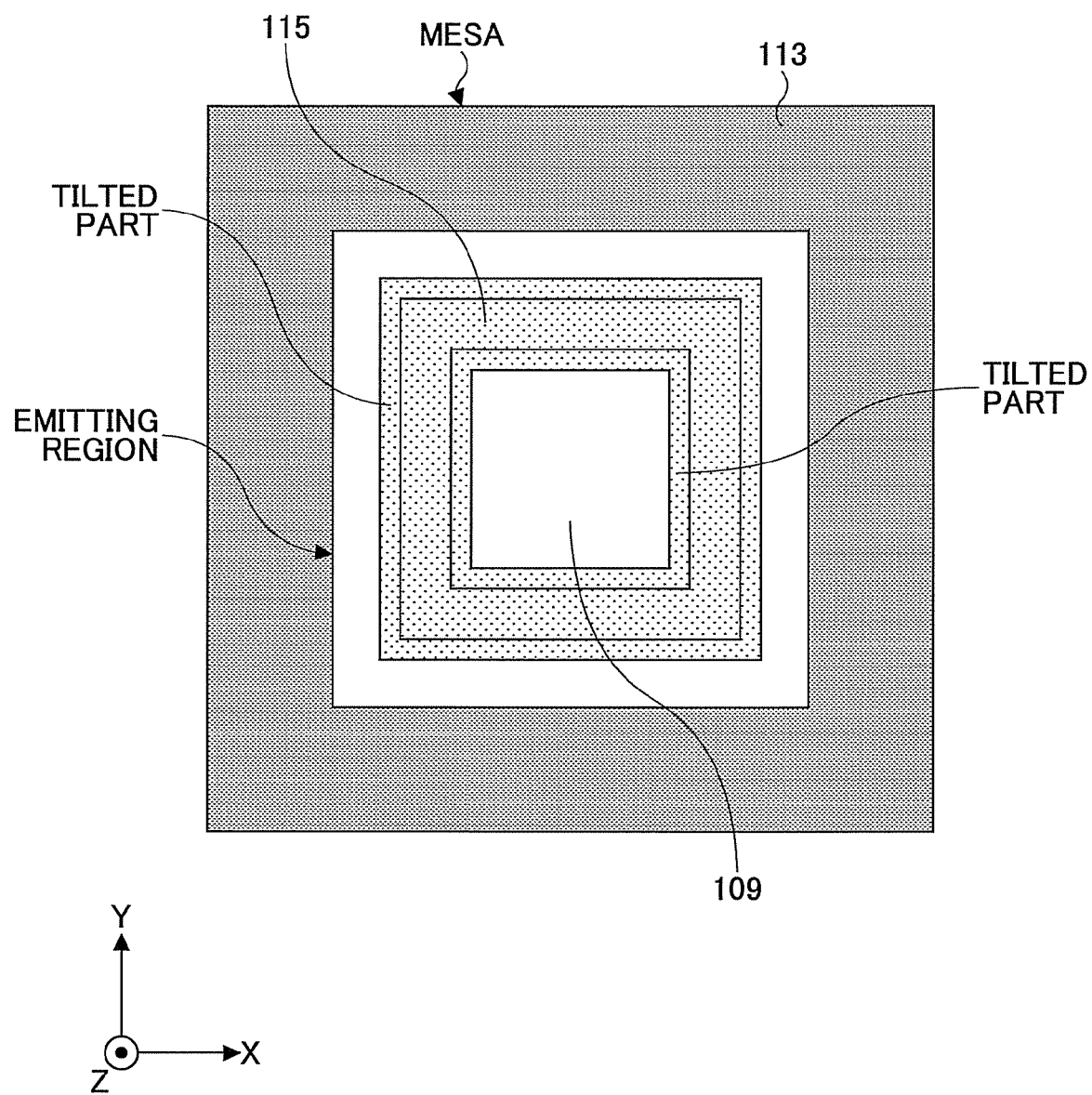
FIG. 12 is an enlarged plan view of the top surface of the mesa in FIG. 11.
Figure 13A:
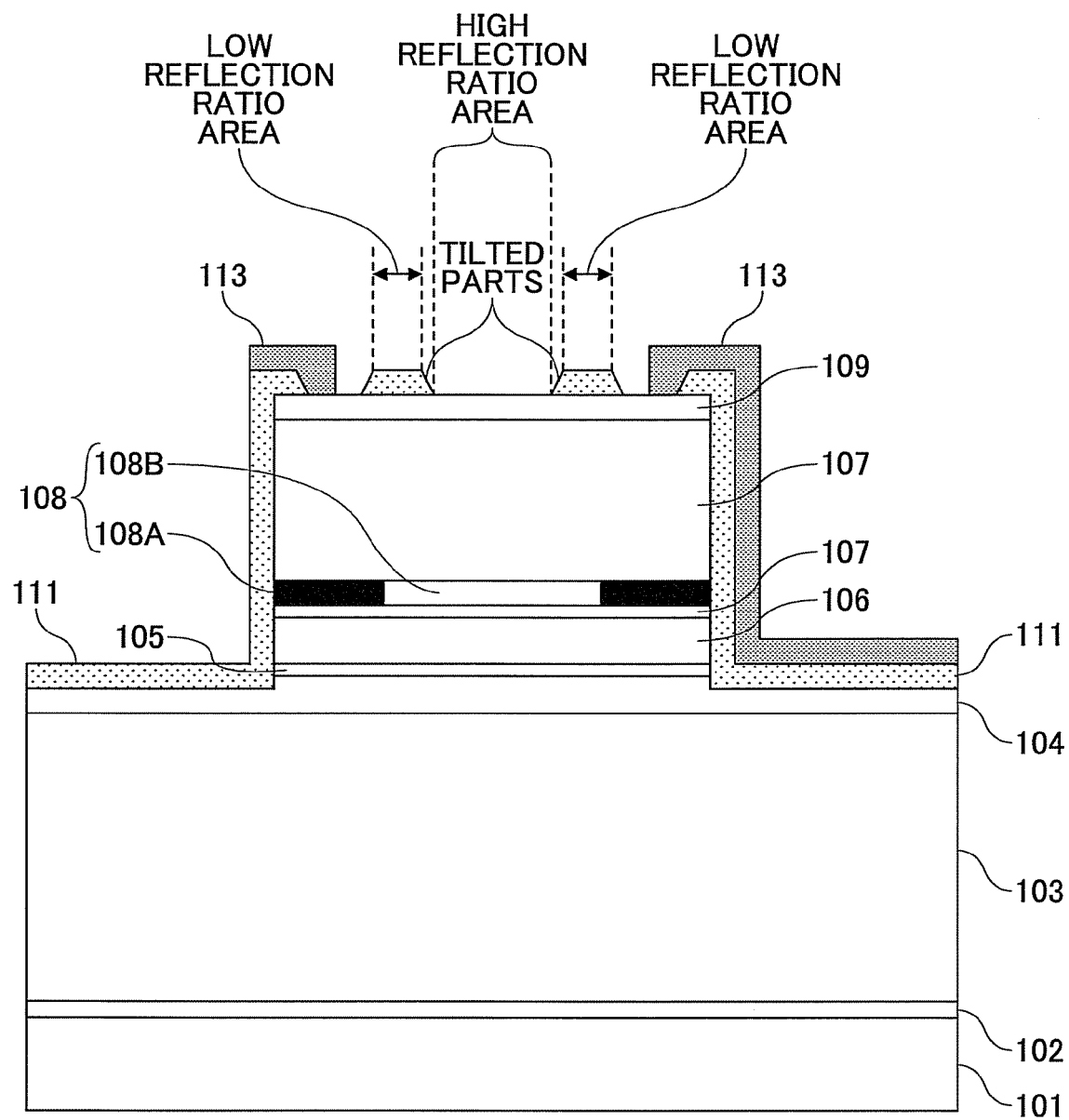
FIGS. 13A and 13B are for describing a low reflection ratio area and a high reflection ratio area.
Figure 13B:
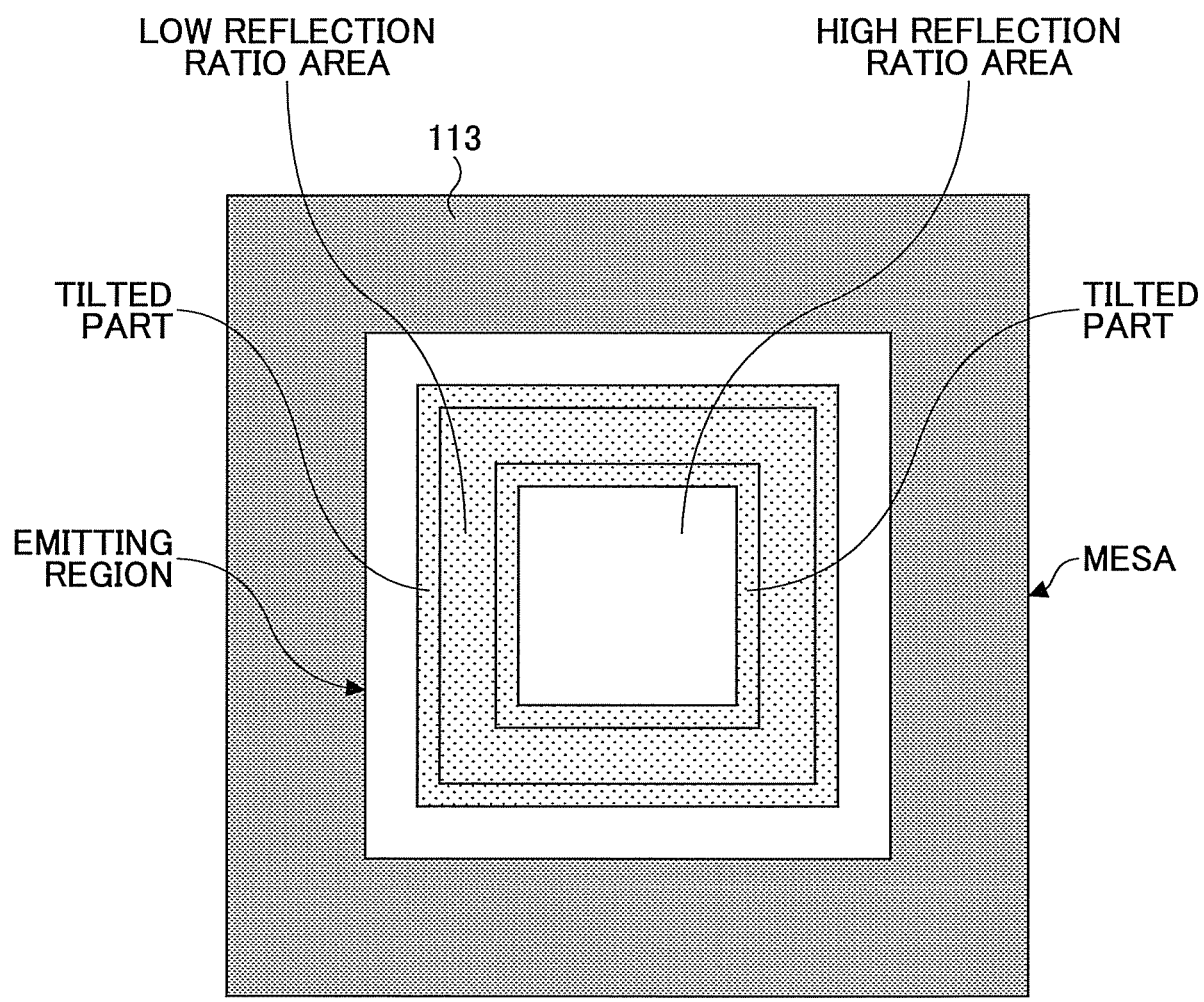

(11) The electrode material that is vapor deposited on the top surface of the mesa is partially lifted off so that the p-side electrode 113 is formed (see FIG. 11). The area surrounded by the p-side electrode 113 is an emitting region. FIG. 12 is an enlarged view of the top surface of the mesa in FIG. 11. In this example, the mode filter 115 is located in the emitting region, as a dielectric film made of SiN having an optical thickness of $\lambda/4$. Accordingly, the reflection ratio of the area where the mode filter 115 is placed in the emitting region is lower than that at the center part of the emitting region (see FIGS. 13A and 13B). That is to say, in the present embodiment, the emitting region includes a low reflection ratio area (peripheral part) and a high reflection ratio area (center part).

Figure 14:
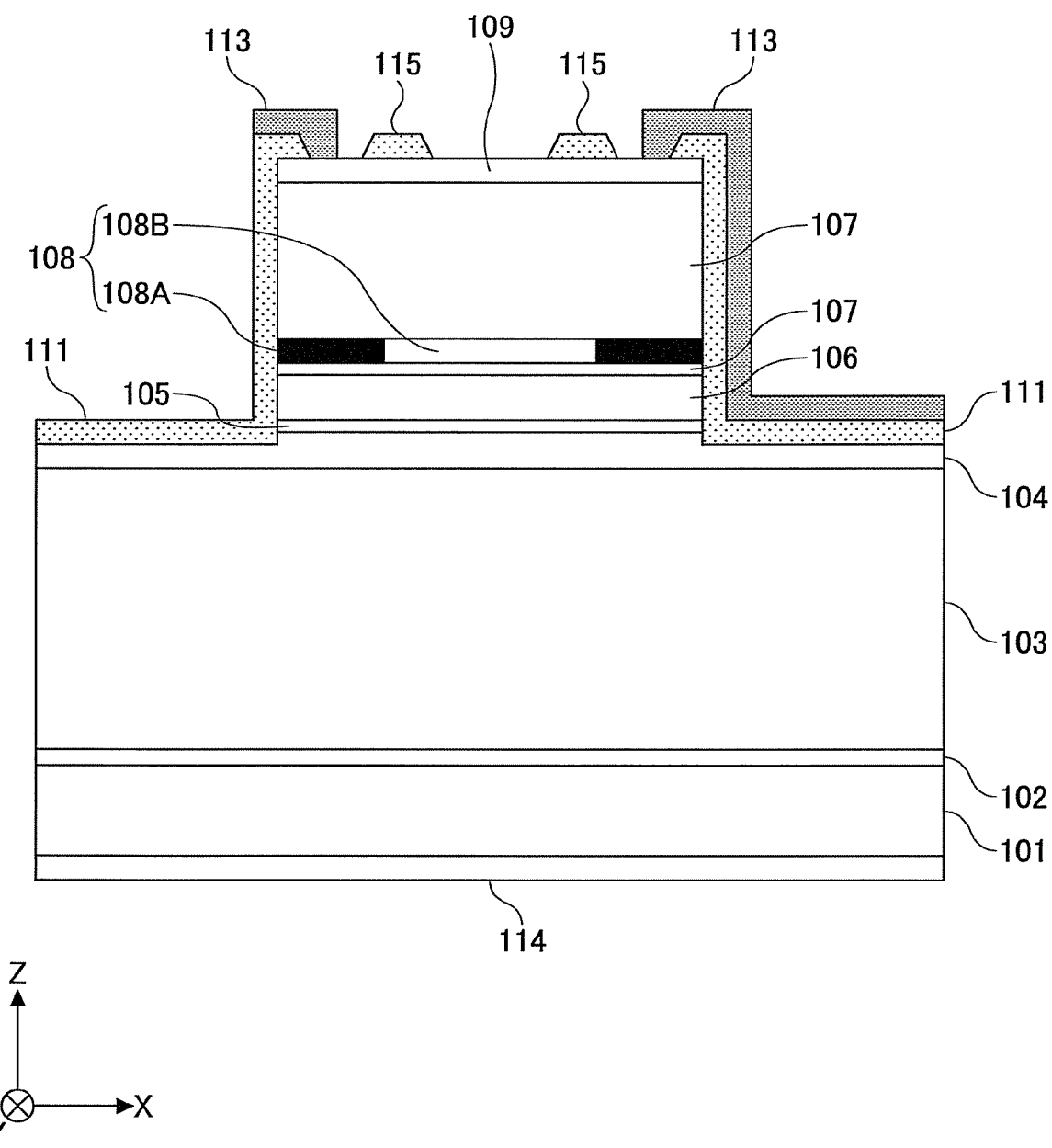
FIG. 14 is for describing the method of manufacturing the surface-emitting laser element according to the first embodiment of the present invention (part 5)

(12) The backside of the substrate 101 is polished until the substrate 101 is a predetermined thickness (for example, 100 µm), and the n-side electrode 114 is formed (see FIG. 14). In this example, the n-side electrode 114 is a multilayer film made of AuGe/Ni/Au.

(13) An annealing process is performed to achieve ohmic conduction between the p-side electrode 113 and the n-side electrode 114. Accordingly, the mesa becomes a light emitting unit.

(14) The lamination body is cut in terms of chips.

Then, various post processes are performed, so that the surface-emitting laser element 100A is formed.

Figure 15:
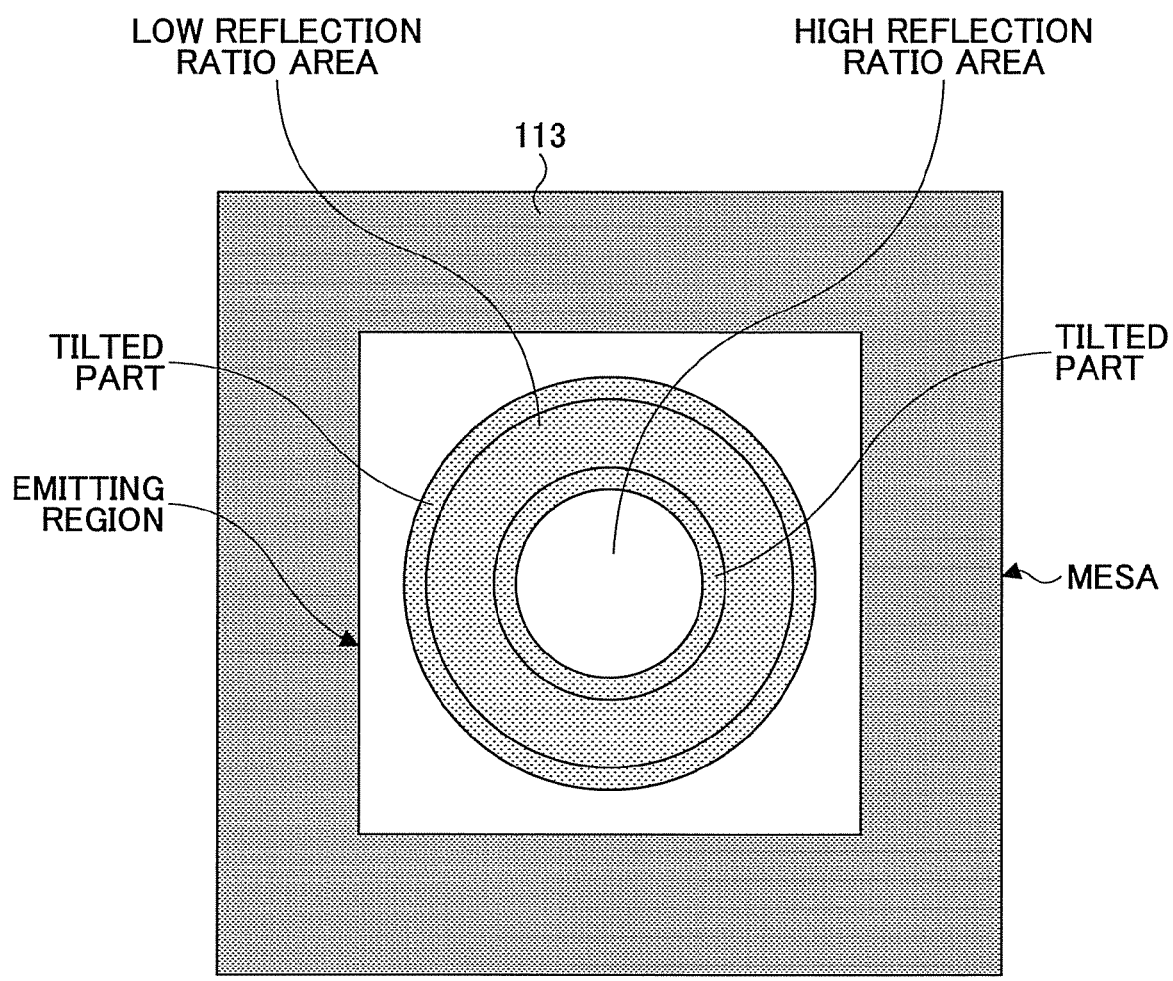
FIG. 15 is for describing a first modification of the surface-emitting laser element according to the first embodiment of the present invention.

FIG. 15 illustrates a first modification of the surface-emitting laser element 100A. As shown in FIG. 15, a mode filter is formed so that the low reflection ratio area is ring-shaped. FIG. 15 is an enlarged plan view of the top surface of the mesa according to first modification.

Figure 16:
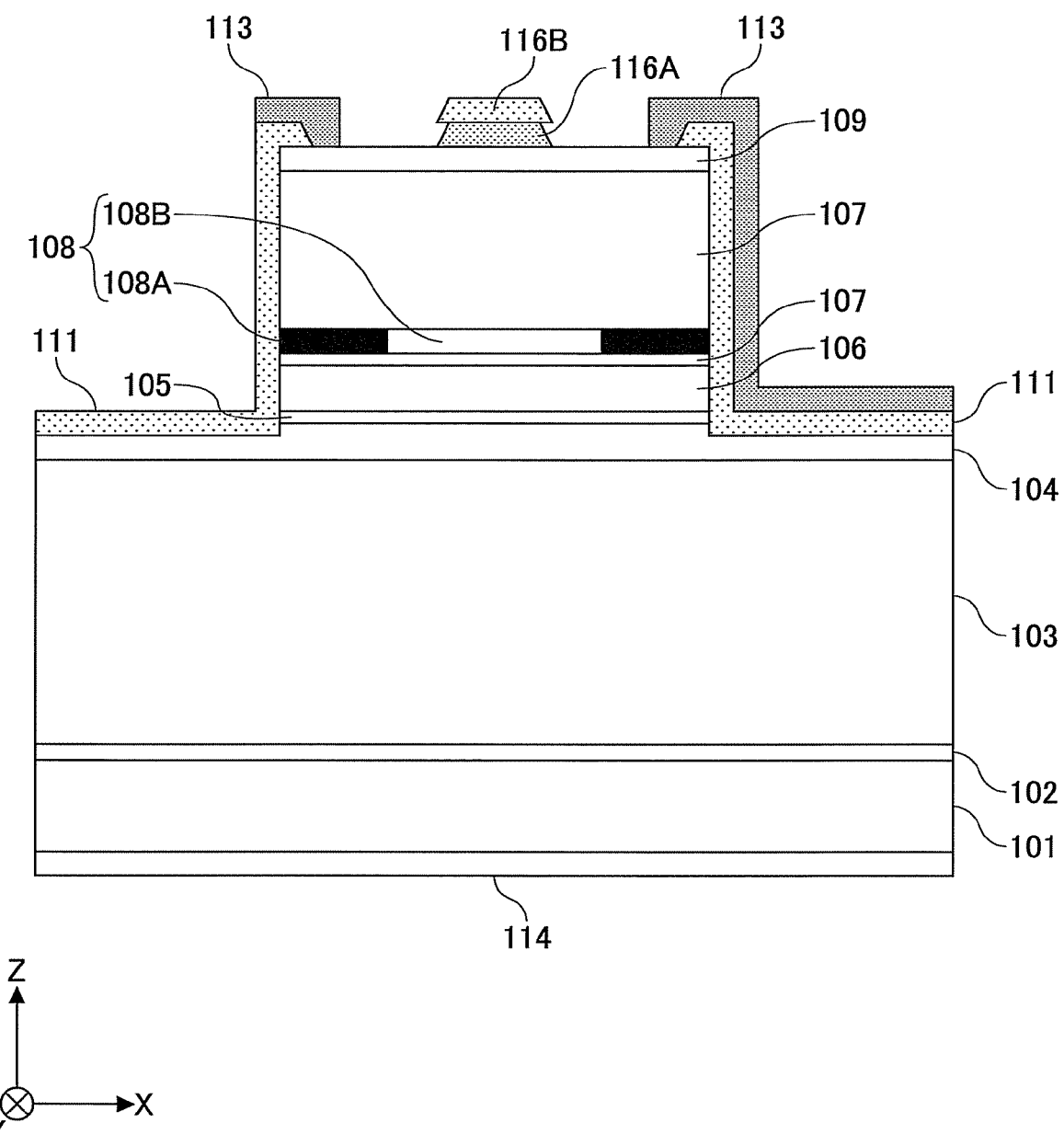
FIG. 16 is for describing a second modification of the surface-emitting laser element according to the first embodiment of the present invention.

FIG. 16 illustrates a second modification of the surface-emitting laser element 100A. As shown in FIG. 16, the dielectric film is provided such that the reflection ratio in the center part of the emitting region is relatively high, instead of providing the dielectric film such that the parts of the emitting region other than the center part have a relatively low reflection ratio. In the second modification, as shown in FIG. 16, the dielectric film includes a low refractive index layer and a high refractive index layer. For example, the dielectric film includes a dielectric film 116A made of $SiO_2$ having an optical thickness of $\lambda/4$, and a dielectric film 116B made of SiN having an optical thickness of $\lambda/4$, that are laminated to each other. FIG. 16 is a cross-sectional view of the surface-emitting laser element according to the second modification parallel to the XZ plane.

Specifically, the refractive index n of $SiO_2$ is 1.46 and the oscillation wavelength λ is 780 nm, and therefore the actual film thickness (=λ/4n) of the dielectric film 116A is set at approximately 134 nm. Furthermore, the refractive index n of SiN is 1.86 and the oscillation wavelength λ is 780 nm, and therefore the actual film thickness (=λ/4n) of the dielectric film 116B is set at approximately 105 nm.

Other embodiments are described below. In the surface-emitting laser elements according to second through fifth embodiments of the present invention, the dielectric films formed in the emitting region is different from that of the surface-emitting laser element 100A. The other elements such as the substrate and the plural semiconductor layers are the same as those of the surface-emitting laser element 100A. Therefore, the following mainly describes the dielectric films formed in the emitting region. Elements corresponding to those of the surface-emitting laser element 100A are denoted by the same reference numerals, and are not further described.

<Second Embodiment: Surface-Emitting Laser Element 100B>

Figure 17:
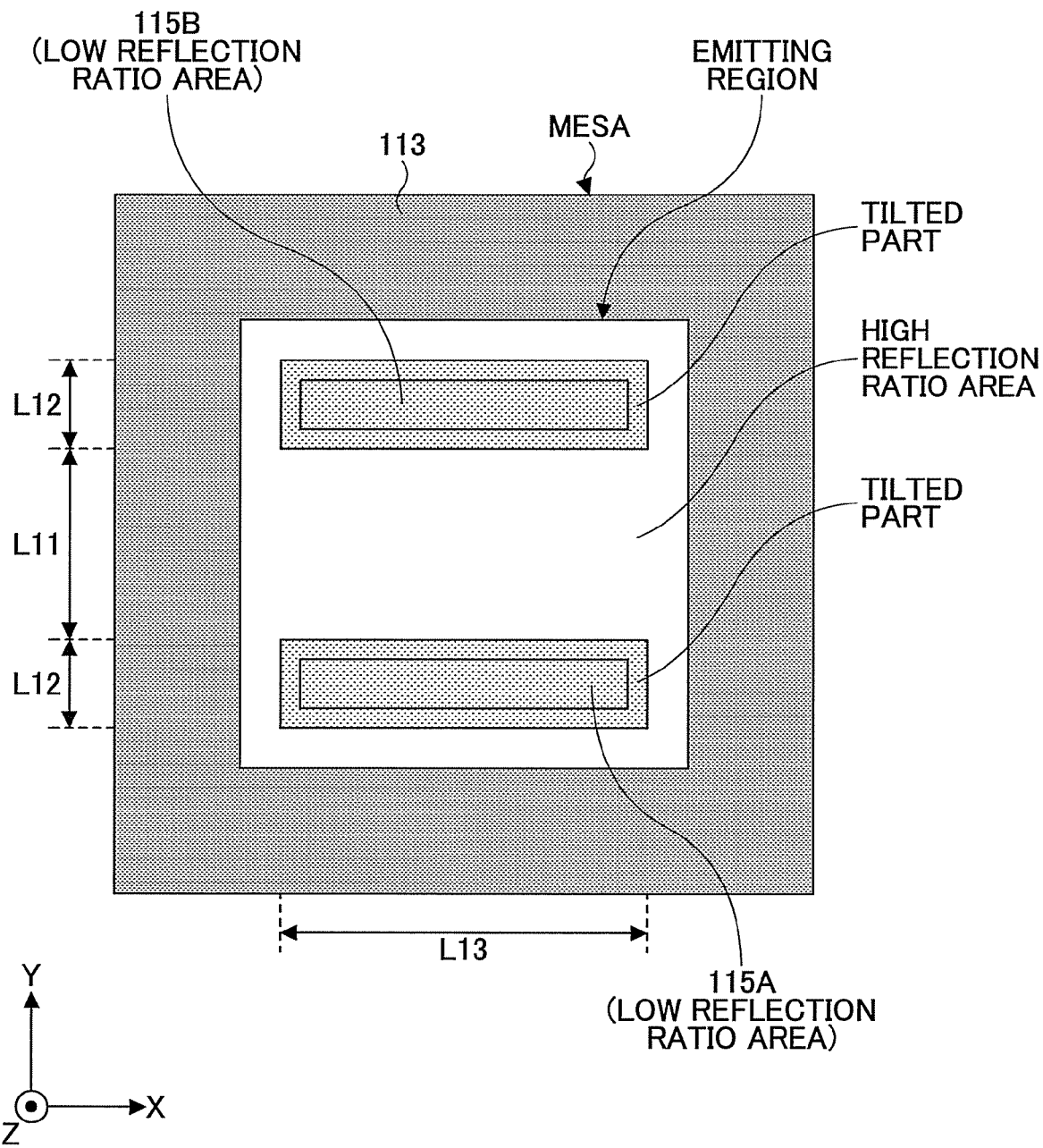
FIG. 17 is for describing a surface-emitting laser element according to a second embodiment of the present invention (part 1)
Figure 18:
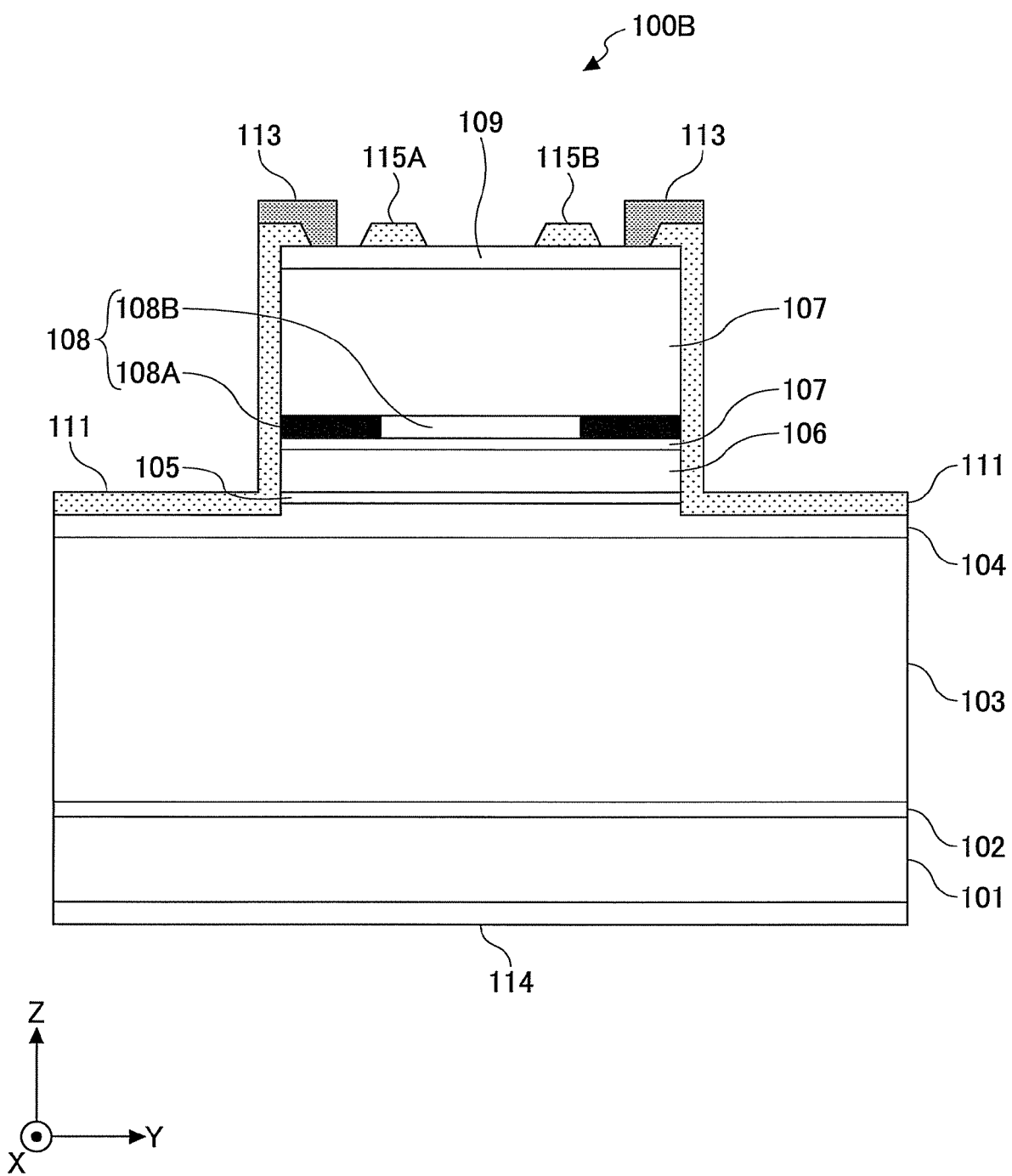
FIG. 18 is for describing the surface-emitting laser element according to the second embodiment of the present invention (part 2)
Figure 19:
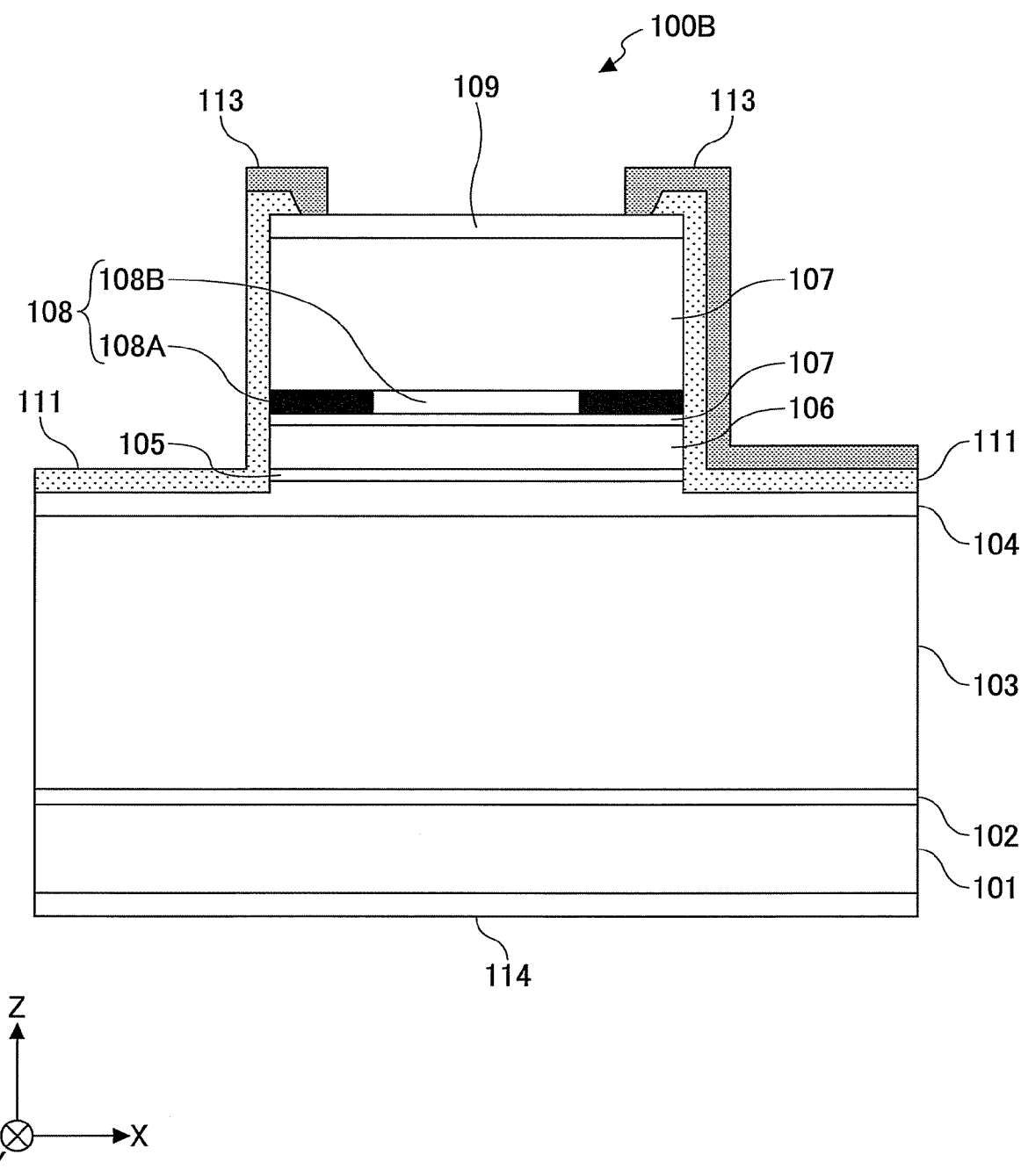
FIG. 19 is for describing the surface-emitting laser element according to the second embodiment of the present invention (part 3)

As illustrated in FIGS. 17 through 19, a surface-emitting laser element 100B includes two mode filters 115A and 115B, such that the low reflection ratio area is formed by two parallel bands. FIG. 17 is an enlarged plan view of the top surface of the mesa of the surface-emitting laser element 100B. FIG. 18 is a cross-sectional view of the surface-emitting laser element 100B parallel to the YZ plane. FIG. 19 is a cross-sectional view of the surface-emitting laser element 100B parallel to the XZ plane. In the example in FIG. 17, L11 is 3.7 µm, L12 is 2 µm, and L13 is 8 µm.

Similar to the case of the surface-emitting laser element 100A, the mode filters have tilted parts along the peripheries, and the tilt angle of the tilted parts is approximately 15 degrees with respect to the surfaces of the tilted parts.

The mode filters may be further divided into plural parts.

Figure 20:
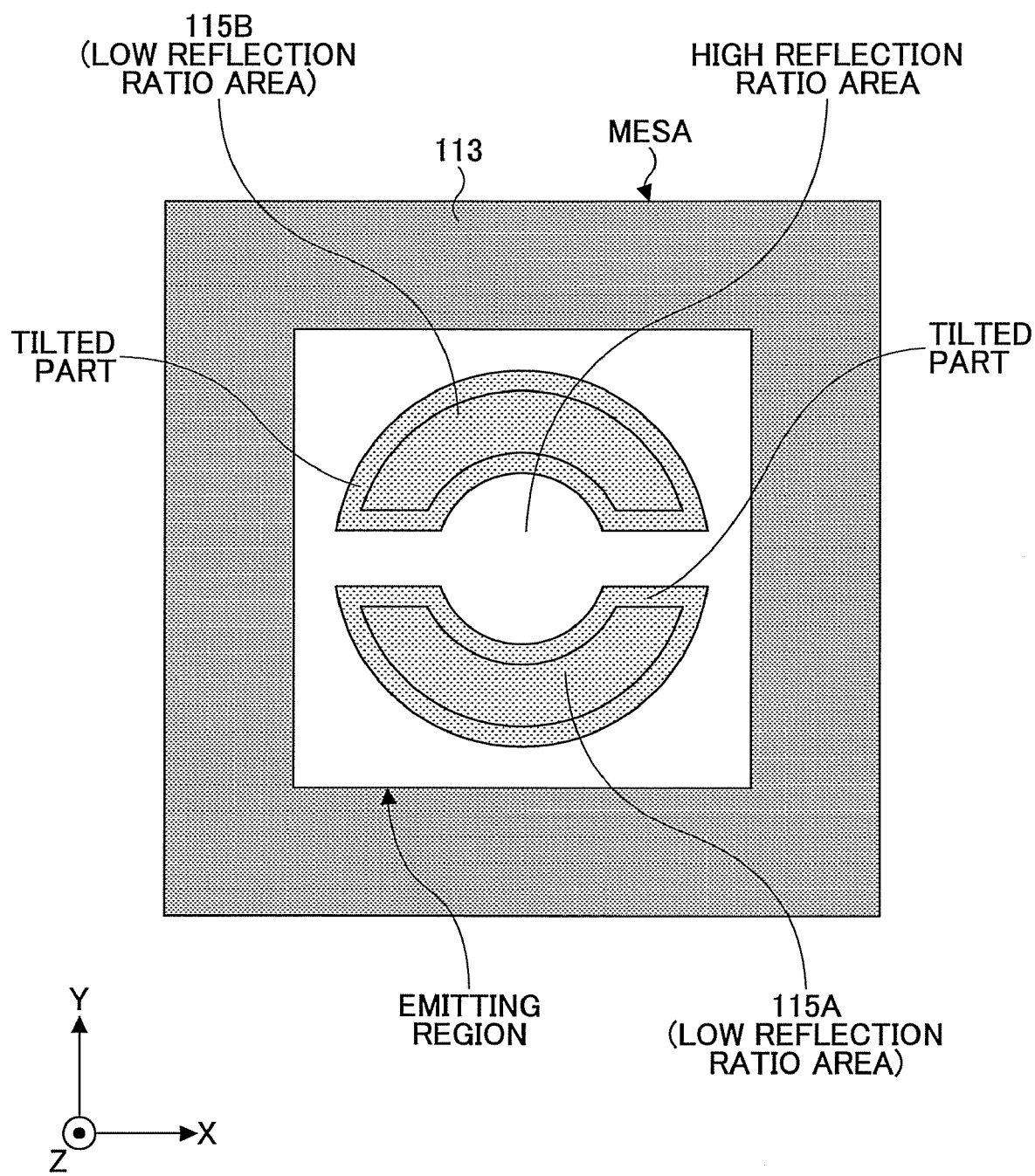
FIG. 20 is for describing a modification the surface-emitting laser element according to the second embodiment of the present invention (part 1)
Figure 21:
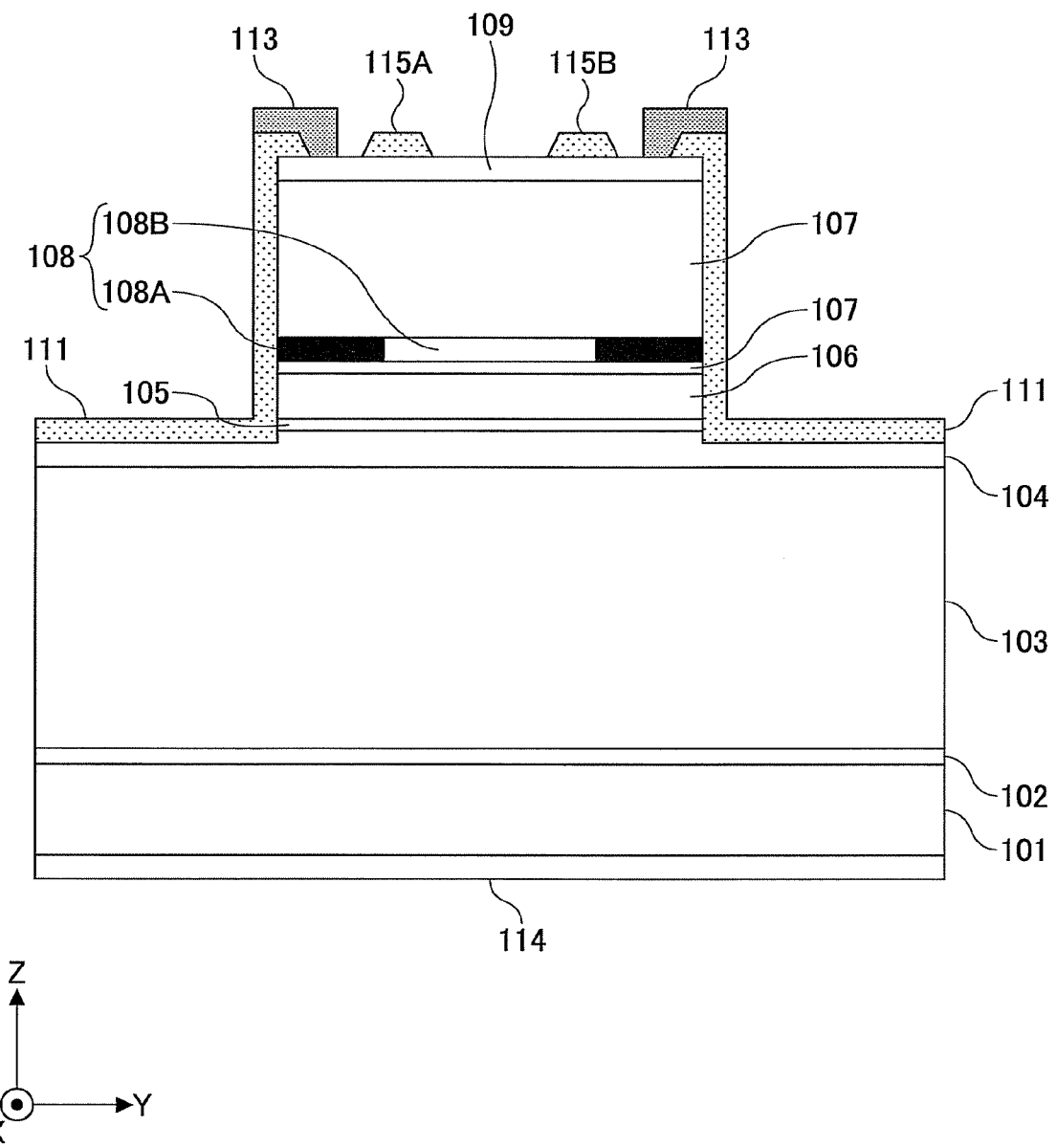
FIG. 21 is for describing the modification the surface-emitting laser element according to the second embodiment of the present invention (part 2)

FIGS. 20 and 21 illustrate a modification of the surface-emitting laser element 100B. As shown in FIGS. 20 and 21, the low reflection ratio areas may be formed by cutting a ring shape into two parts along a surface parallel to the XZ surface, and then separating the two parts in the Y axis direction. FIG. 20 is an enlarged plan view of the top surface of the mesa of the modification of the surface-emitting laser element 100B. FIG. 21 is a cross-sectional view of the modification of the surface-emitting laser element 100B parallel to the YZ plane. The low reflection ratio areas may be further divided into plural parts. <

Third Embodiment: Surface-Emitting Laser Element 100C>

Figure 22:
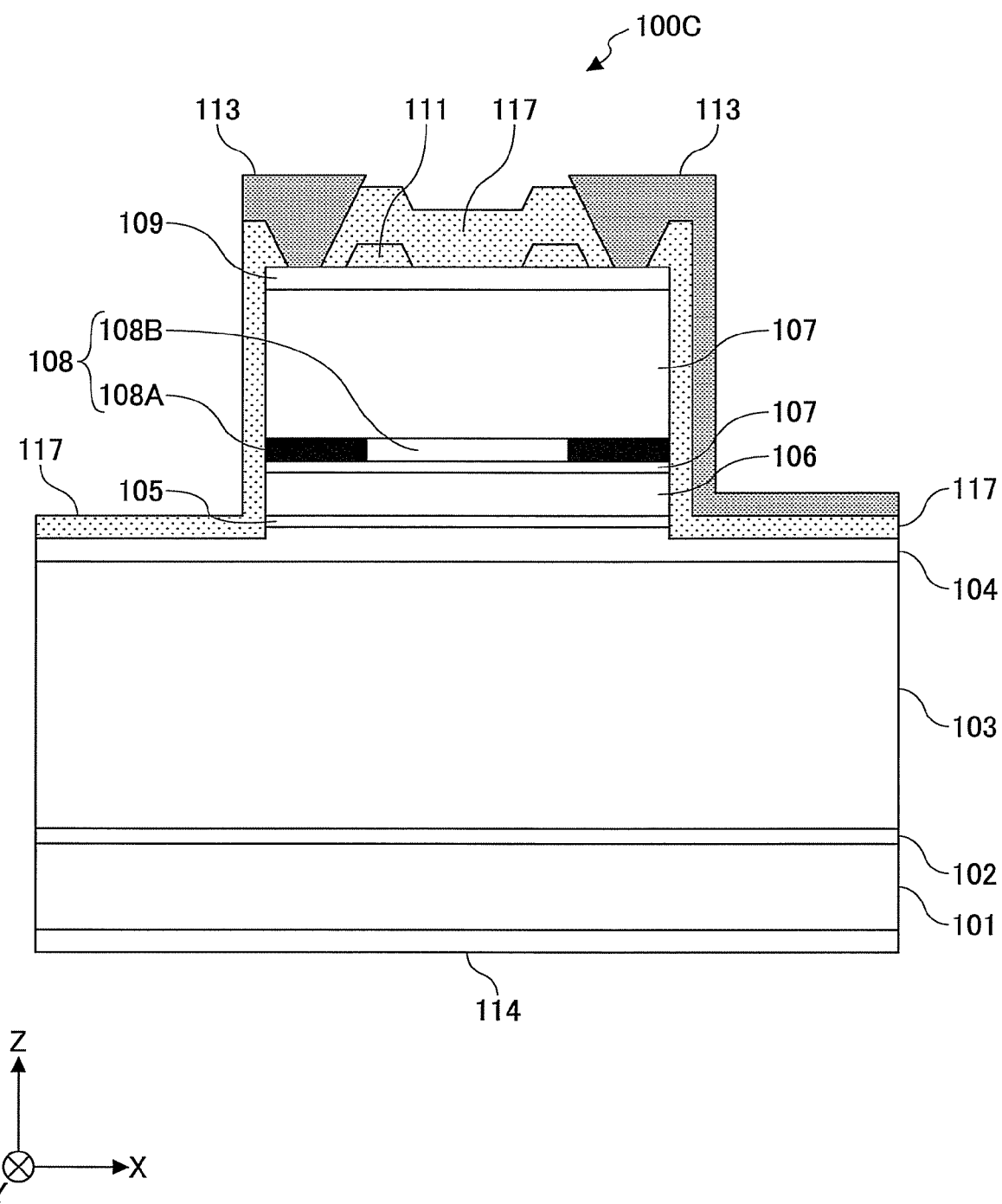
FIG. 22 is for describing a surface-emitting laser element according to a third embodiment of the present invention.
Figure 23:
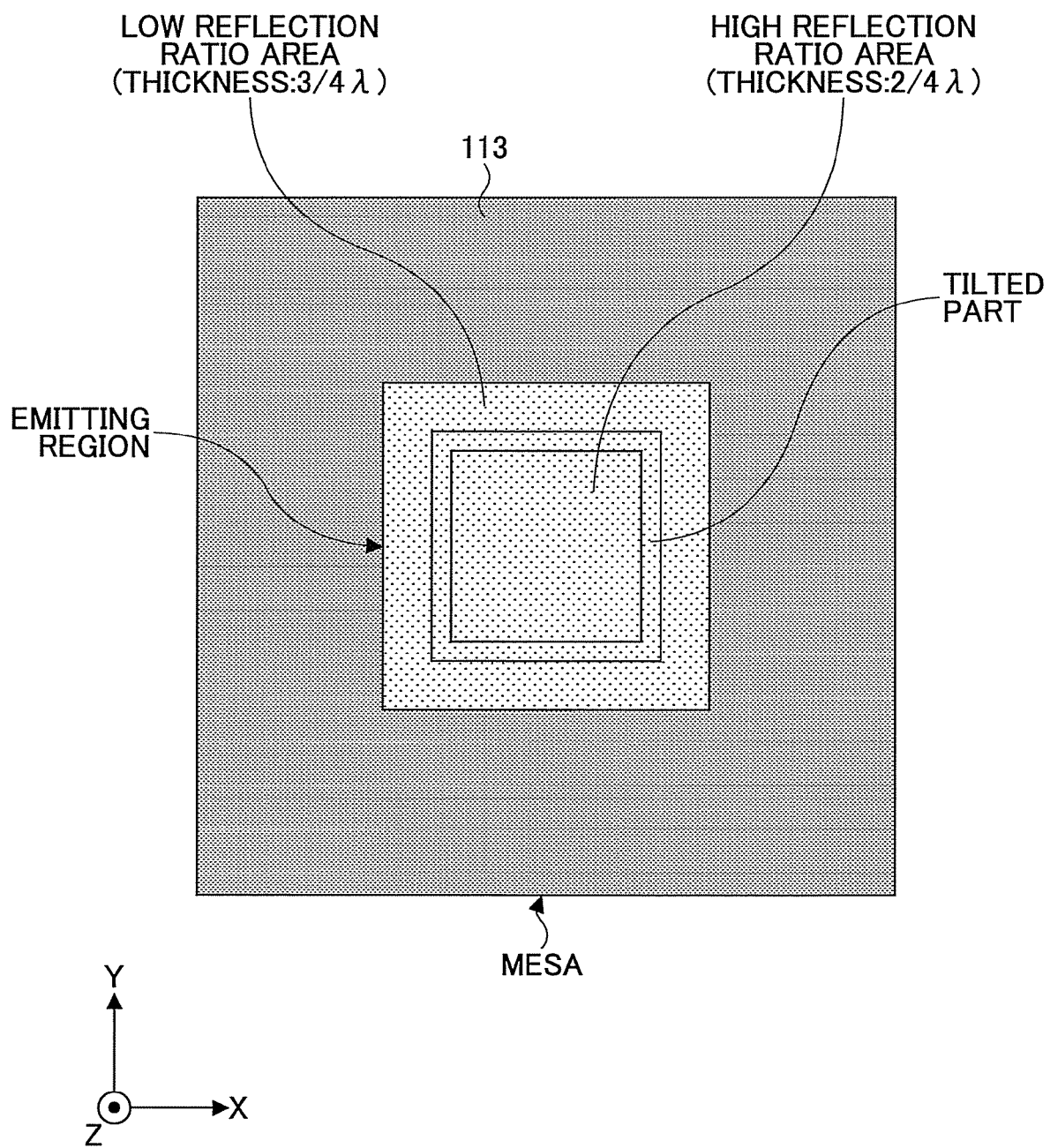
FIG. 23 is an enlarged plan view of the top surface of the mesa in FIG. 22.

As illustrated in FIGS. 22 and 23, a surface-emitting laser element 100C is formed by laminating a dielectric film 117 that has an optical thickness of 2λ/4 and that is made of Sin, on the entire emitting region of the surface-emitting laser element 100A. FIG. 22 is a cross-sectional view of the surface-emitting laser element 100C parallel to the XZ plane. FIG. 23 is an enlarged plan view of the top surface of the mesa in FIG. 22. The actual film thickness (=2λ/4n) of the dielectric film 117 is set at approximately 210 nm, because the refractive index n of SiN is 1.86 and the oscillation wavelength λ is 780 nm.

The center part of the emitting region is covered by the dielectric film 117 made of SiN having an optical thickness of 2λ/4. The mode filter is formed by the protection layer 111 made of SiN having an optical thickness of λ/4 and the dielectric film 117 made of SiN having an optical thickness of 2λ/4. That is to say, the mode filter is formed of a dielectric film made of SiN having an optical thickness of 3λ/4.

Similar to the surface-emitting laser element 100A described above, the mode filter of the surface-emitting laser element 100C has a tilted part around its periphery, and the tilt angle of the tilted parts is approximately 15 degrees with respect to the surfaces of the tilted parts.

In this case, the entire emitting region is covered by the dielectric film 117, and therefore the emitting region can be prevented from being oxidized or contaminated. The center part of the emitting region is covered by the dielectric film 117 having an optical thickness that is an even multiple of λ/2, and therefore the same optical properties as those of case where the dielectric film 117 is not provided are achieved, without decreasing the reflection ratio.

Figure 24:
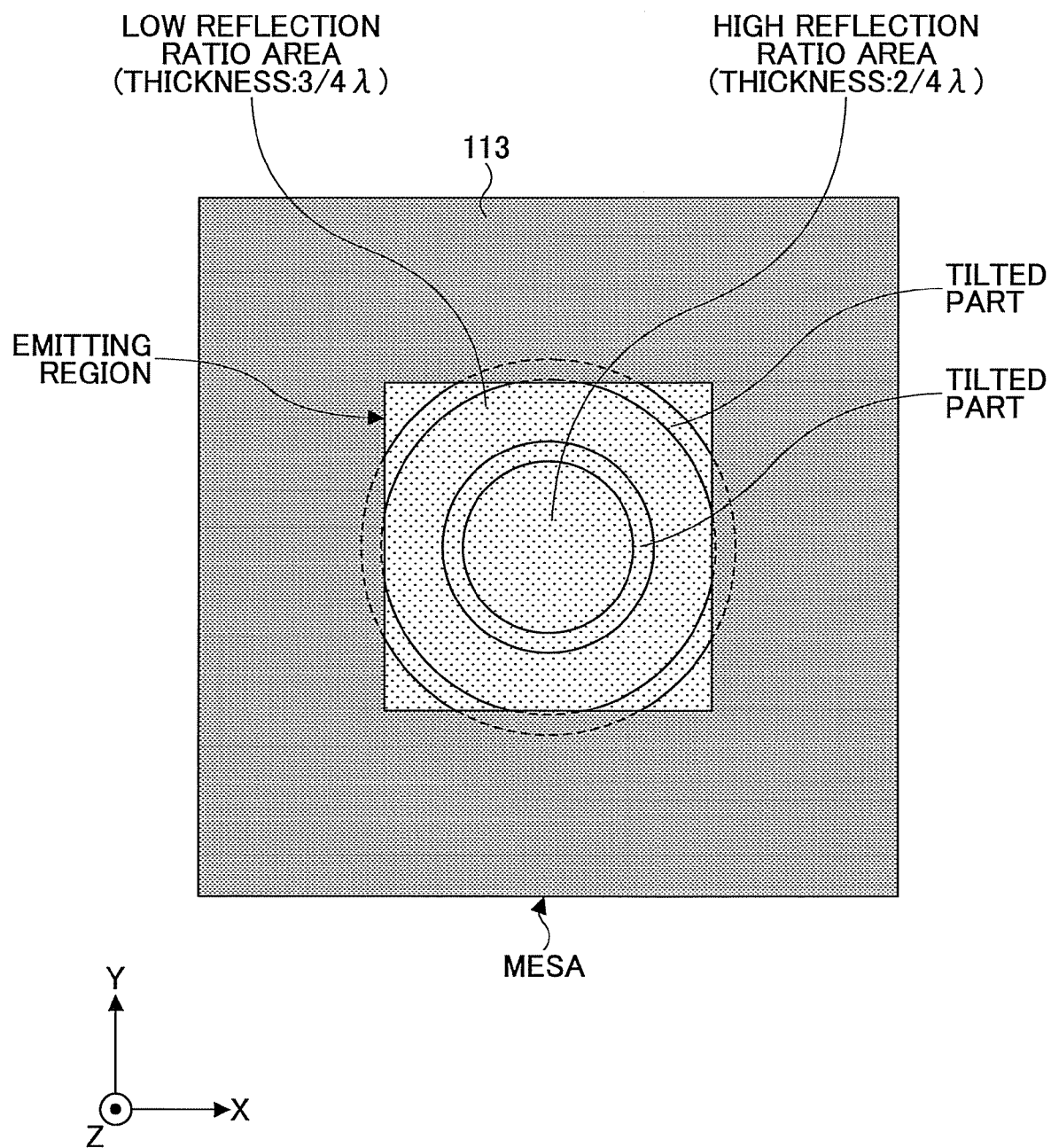
FIG. 24 is for describing a first modification of the surface-emitting laser element according to the third embodiment of the present invention.

FIG. 24 illustrates a first modification of the surface-emitting laser element 100C. As shown in FIG. 24, a mode filter is formed so that the low reflection ratio area is ring-shaped. FIG. 24 is an enlarged plan view of the top surface of the mesa according to first modification.

Figure 25:
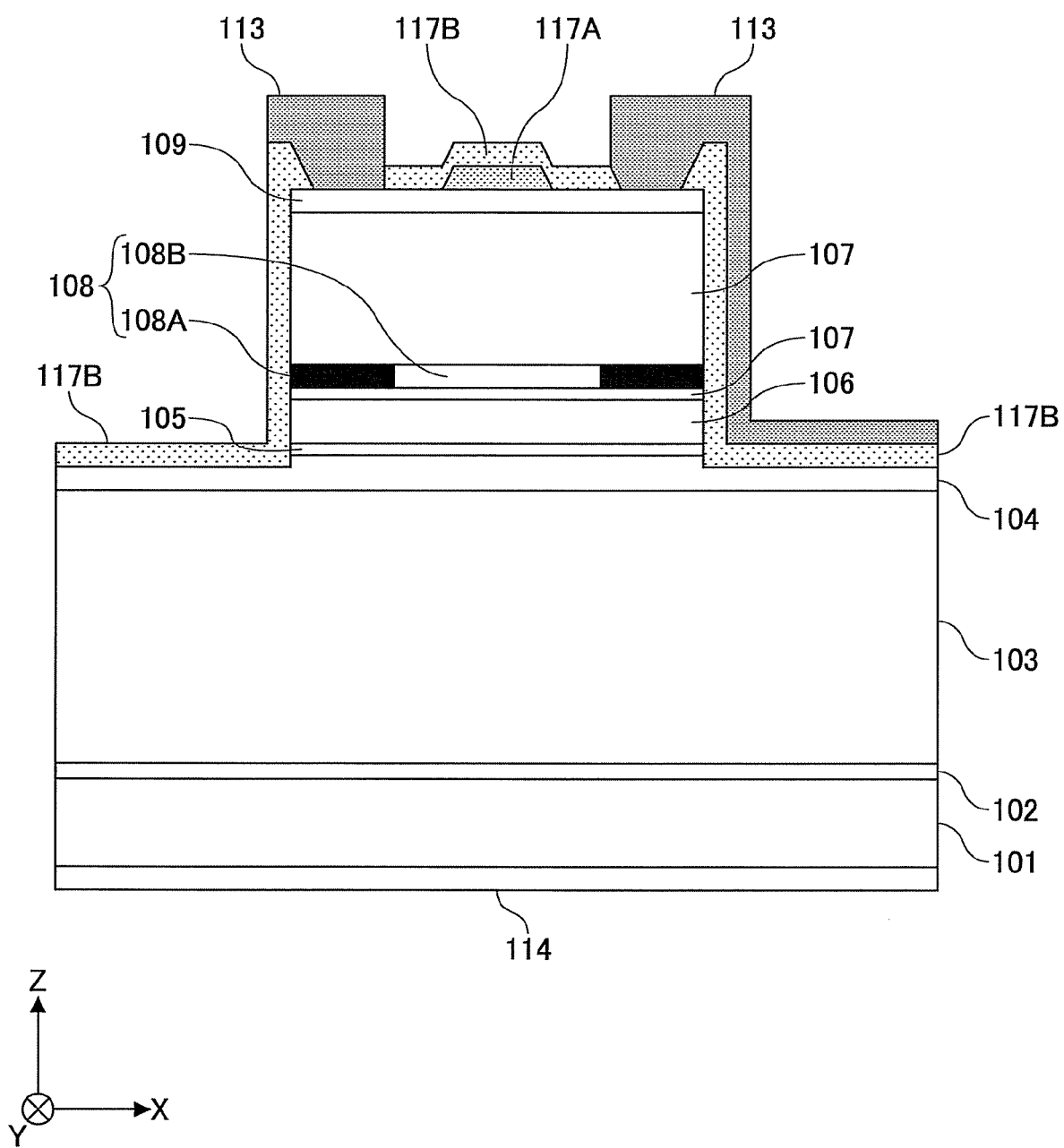
FIG. 25 is for describing a second modification of the surface-emitting laser element according to the third embodiment of the present invention.

FIG. 25 illustrates a second modification of the surface-emitting laser element 100C. As shown in FIG. 25, the dielectric film is provided such that the reflection ratio in the center part of the emitting region is relatively high, instead of providing the dielectric film such that the parts of the emitting region other than the center part have a relatively low reflection ratio. In the second modification, as shown in FIG. 25, the dielectric film includes a low refractive index layer and a high refractive index layer. For example, the dielectric film includes a transparent dielectric film 117B made of $SiO_2$ having an optical thickness of λ/4 and a dielectric film 117A made of SiN having an optical thickness of λ/4 that are laminated to each other. FIG. 25 is a cross-sectional view of the surface-emitting laser element according to the second modification parallel to the XZ plane.

Specifically, the refractive index n of $SiO_2$ is 1.46 and the oscillation wavelength λ is 780 nm, and therefore the actual film thickness (=λ/4n) of the dielectric film 117B is set at approximately 134 nm. Furthermore, the refractive index n of SiN is 1.86 and the oscillation wavelength λ is 780 nm, and therefore the actual film thickness (=λ/4n) of the dielectric film 117A is set at approximately 105 nm. <

Fourth Embodiment: Surface-Emitting Laser Element 100D>

Figure 26:
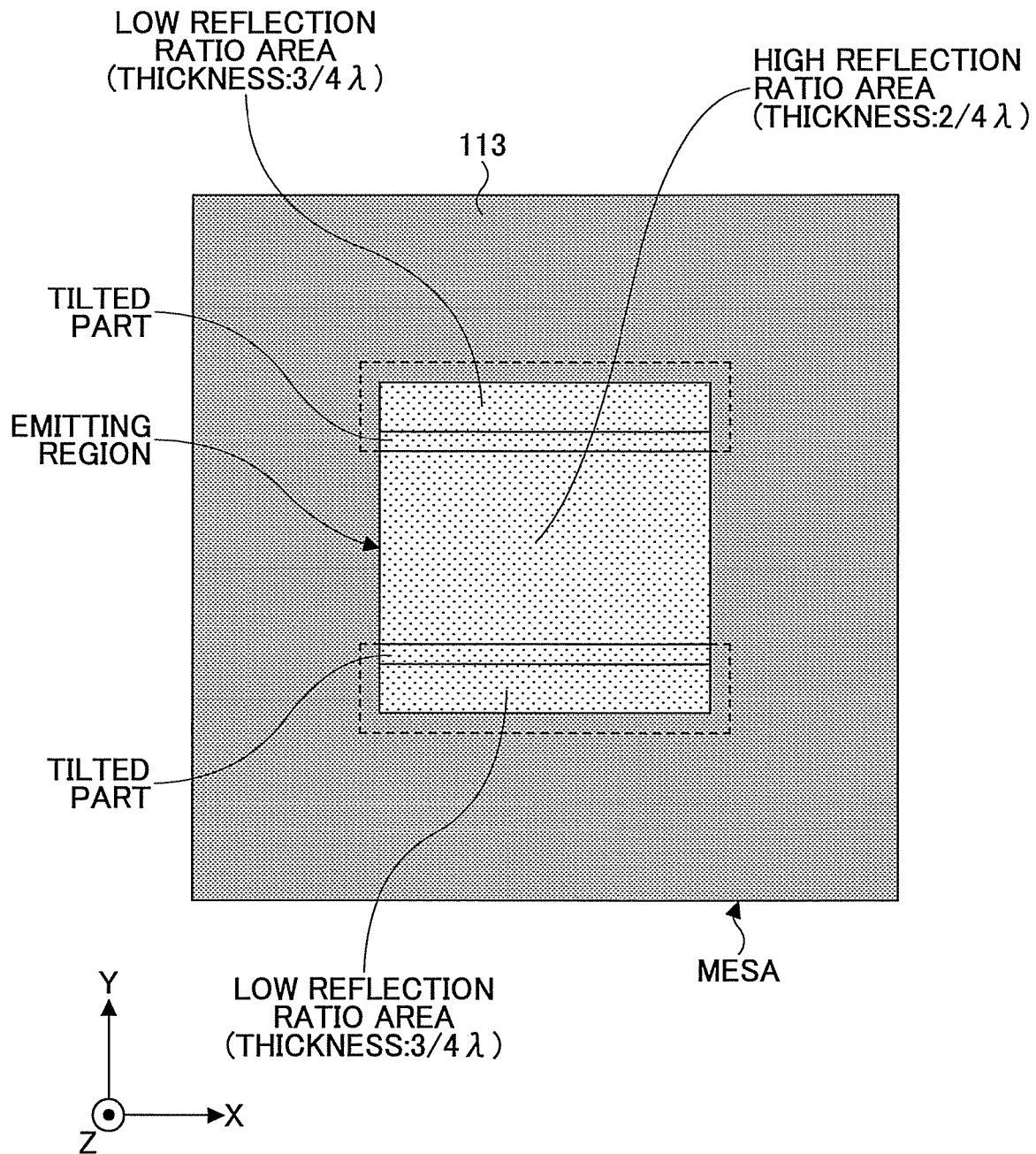
FIG. 26 is for describing a surface-emitting laser element according to a fourth embodiment of the present invention (part 1)
Figure 27:
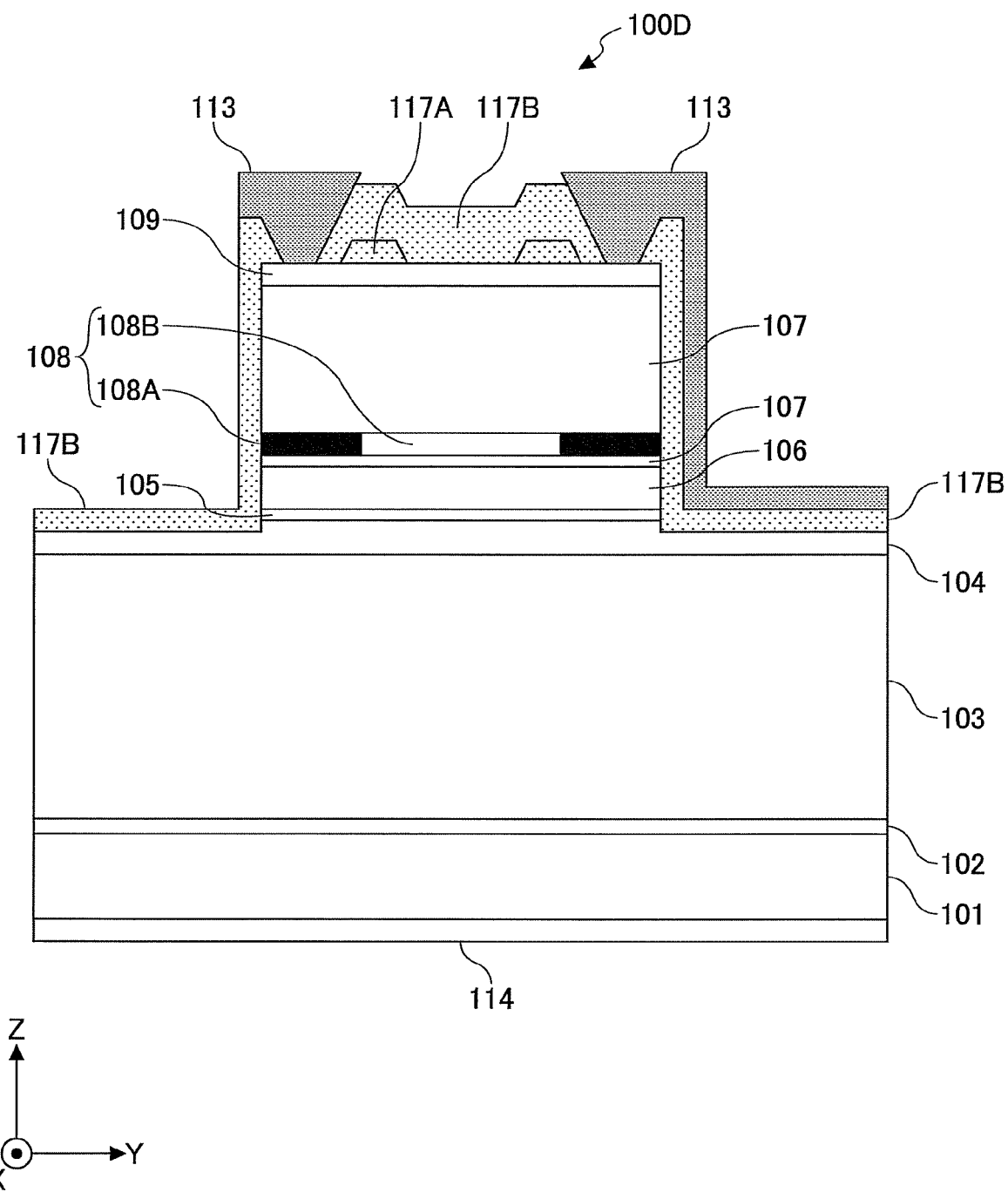
FIG. 27 is for describing the surface-emitting laser element according to the fourth embodiment of the present invention (part 2)
Figure 28:
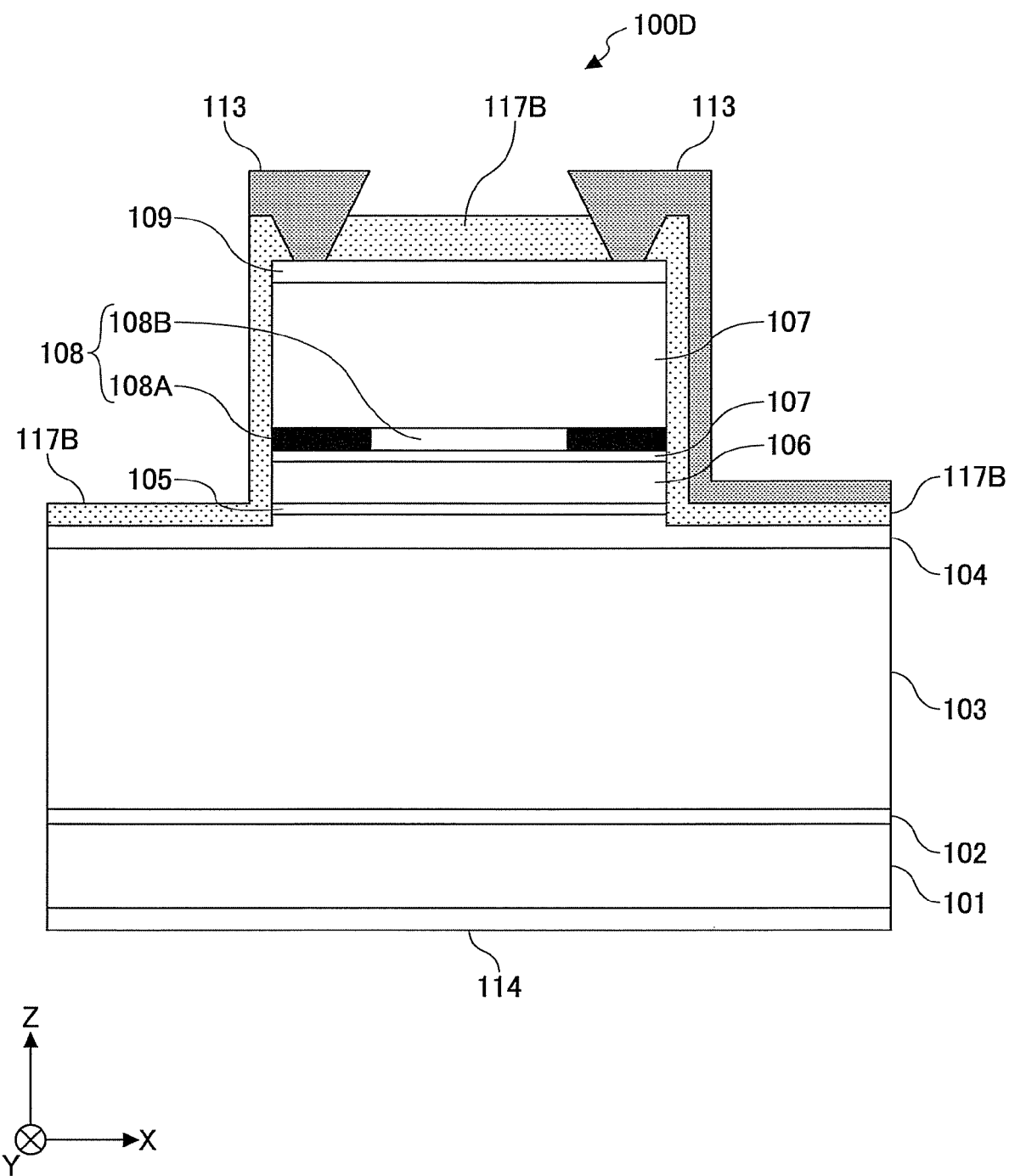
FIG. 28 is for describing the surface-emitting laser element according to the fourth embodiment of the present invention (part 3)

As illustrated in FIGS. 26 through 28, in a surface-emitting laser element 100D, the low reflection ratio area of the surface-emitting laser element 100C formed by two parallel bands. FIG. 26 is an enlarged plan view of the top surface of the mesa of the surface-emitting laser element 100D. FIG. 27 is a cross-sectional view of the surface-emitting laser element 100D parallel to the YZ plane. FIG. 28 is a cross-sectional view of the surface-emitting laser element 100D parallel to the XZ plane.

Similar to the case of the surface-emitting laser element 100A, the mode filters have tilted parts along the peripheries, and the tilt angle of the tilted parts is approximately 15 degrees with respect to the surfaces of the tilted parts.

The mode filters may be further divided into plural parts.

Figure 29:
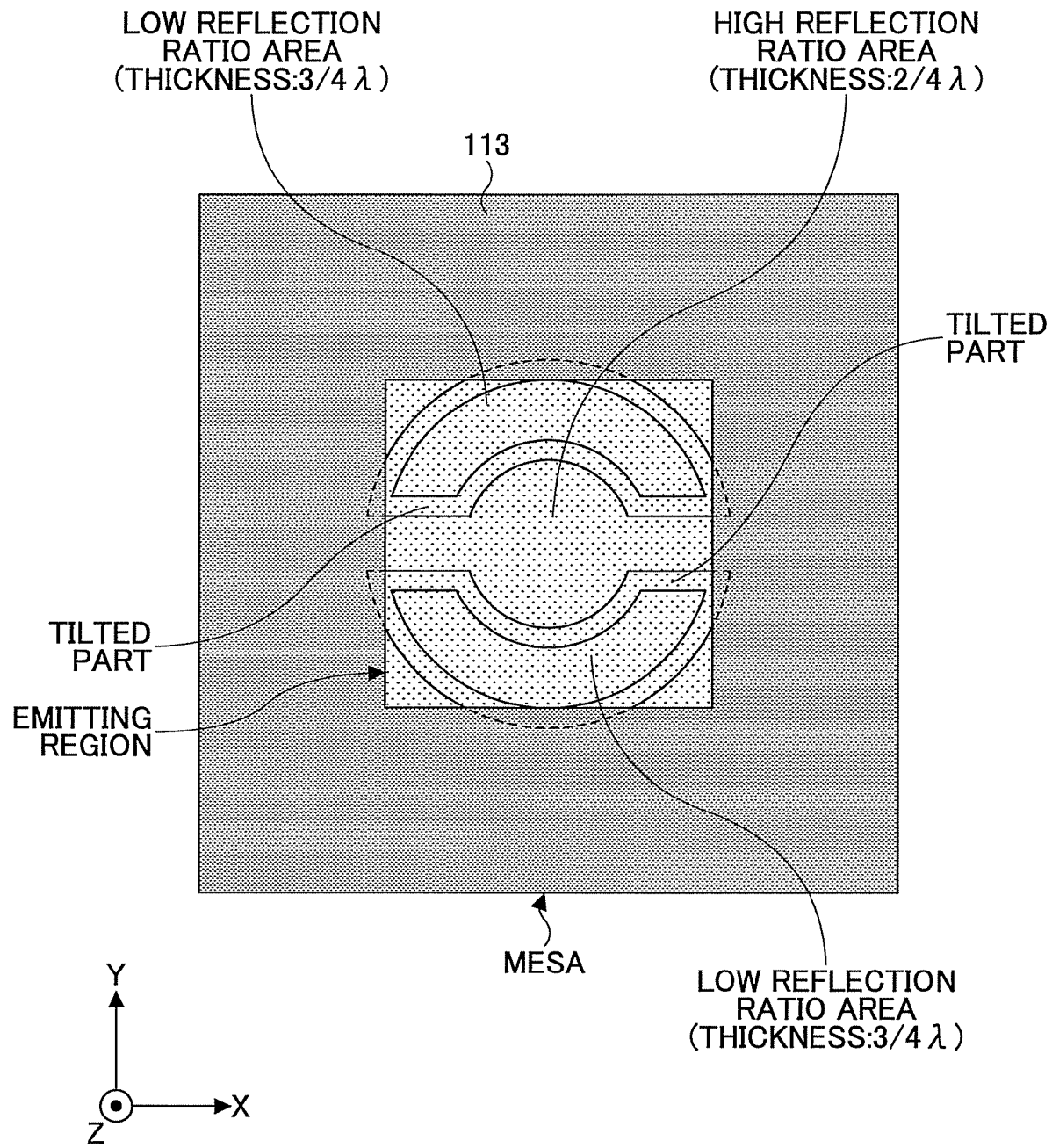
FIG. 29 is for describing a modification the surface-emitting laser element according to the fourth embodiment of the present invention (part 1)
Figure 30:
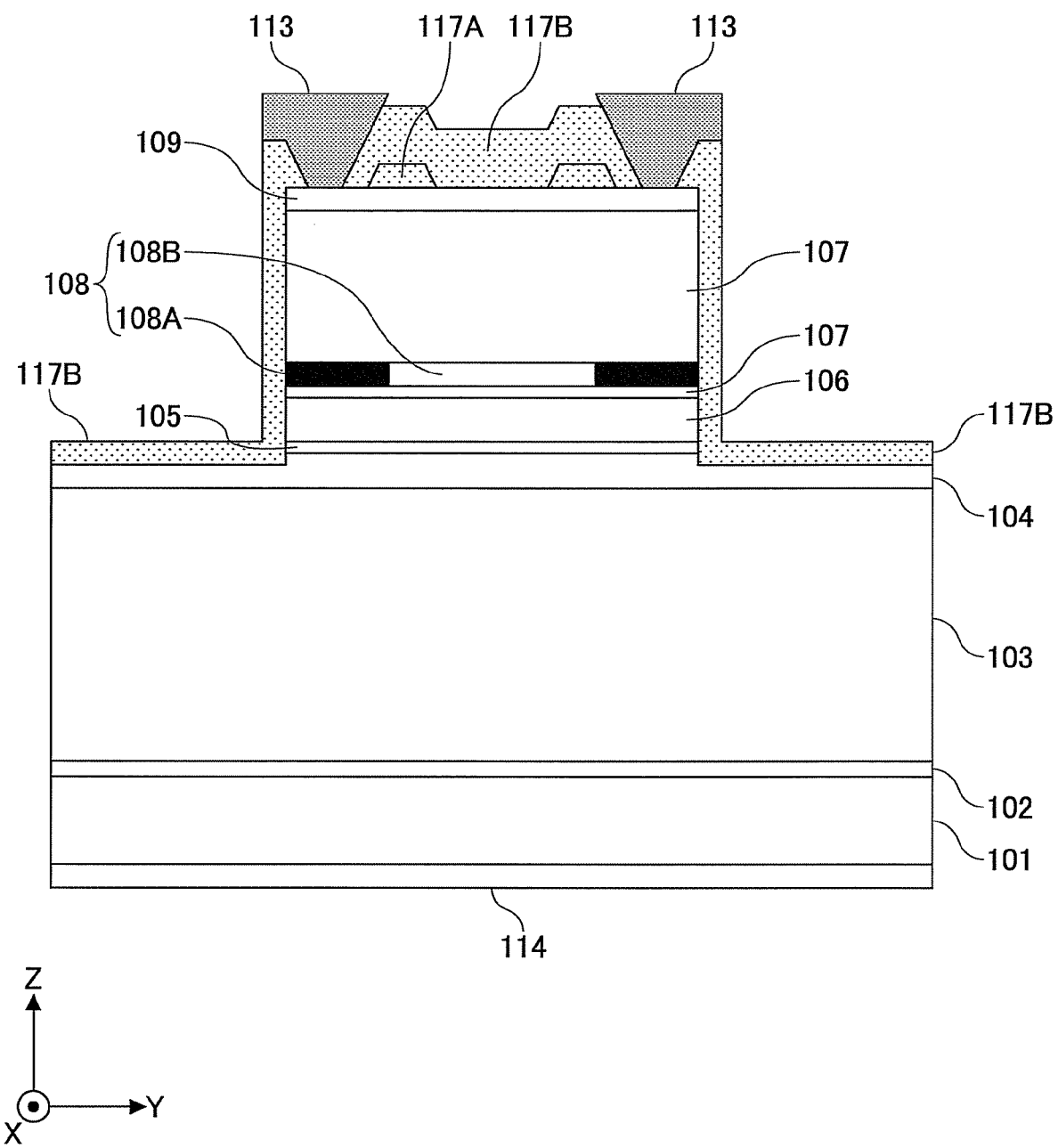
FIG. 30 is for describing the modification the surface-emitting laser element according to the fourth embodiment of the present invention (part 2)

FIGS. 29 and 30 illustrate a modification of the surface-emitting laser element 100D. As shown in FIGS. 29 and 30, the low reflection ratio areas may be formed by cutting a ring shape into two parts along a surface parallel to the XZ surface, and then separating the two parts in the Y axis direction. FIG. 29 is an enlarged plan view of the top surface of the mesa of the modification of the surface-emitting laser element 100D. FIG. 30 is a cross-sectional view of the modification of the surface-emitting laser element 100D parallel to the YZ plane.

The low reflection ratio areas may be further divided into plural parts. <

<Fifth Embodiment: Surface-Emitting Laser Element 100E>

In a surface-emitting laser element 100E, the tilt angle of the tilted parts is approximately 70 degrees with respect to the surfaces of the tilted parts. The surface-emitting laser element 100E is not shown in any figures.

In the method of manufacturing the surface-emitting laser element 100E, a process of exposing the protection layer 111 to oxygen plasma is performed before the procedure (8) (oxygen plasma exposing process). For example, the oxygen plasma exposing process is performed by using a parallel plate type plasma device for ten minutes with an oxygen gas flow rate of 200 sccm, oxygen gas pressure of 133 Pa, and high frequency output of 200 W. By performing the oxygen plasma exposing process, the adhesiveness between the photoresist and the protection layer 111 increases. By wet-etching the protection layer 111 at 60 nm/minute through 70 nm/minute, the tilt angle with respect to the emitting surface can be adjusted to approximately 70 degrees.

<Conventional Surface-Emitting Laser Element 100H>

Figure 31:
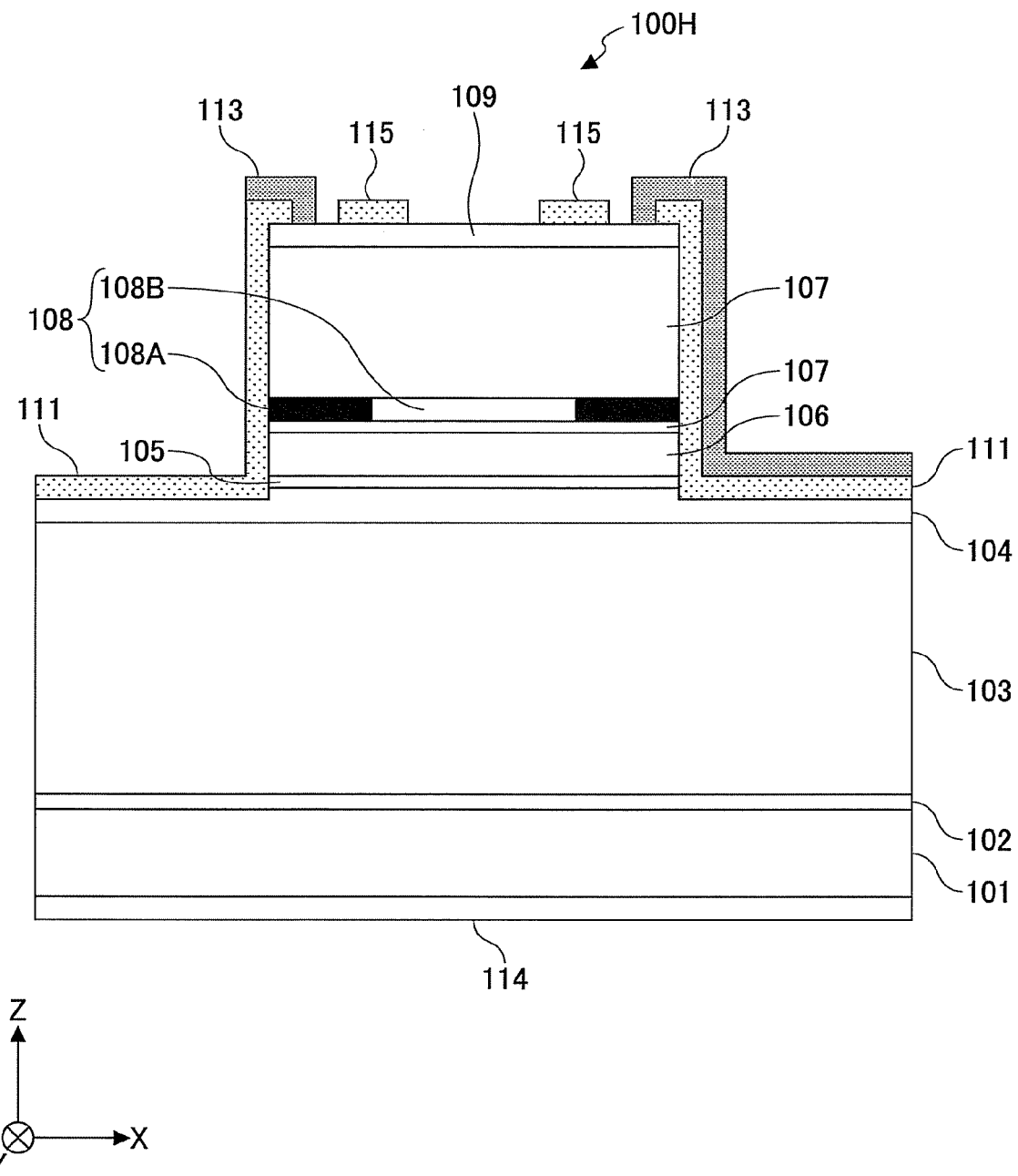
FIG. 31 is for describing a surface-emitting laser element according to a comparative example.
Figure 32:
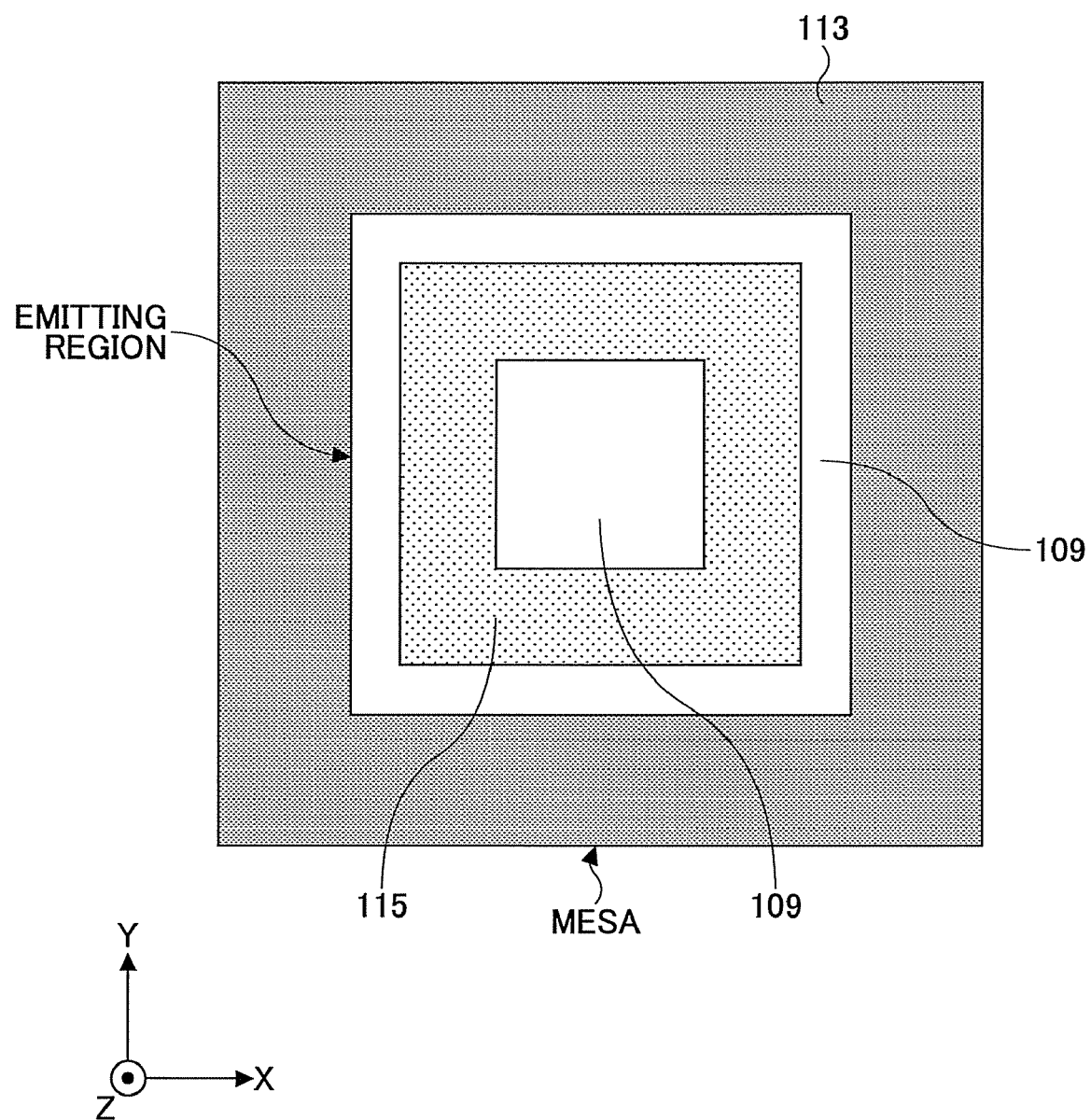
FIG. 32 is an enlarged plan view of the top surface of the mesa in FIG. 31.

As illustrated in FIGS. 31 and 32, in a surface-emitting laser element 100H, the tilt angle of the tilted parts is approximately 85 degrees with respect to the surfaces of the tilted parts of the surface-emitting laser element 100A. FIG. 31 is a cross-sectional view of the surface-emitting laser element 100H parallel to the XZ plane. FIG. 32 is an enlarged plan view of the top surface of the mesa of FIG. 31.

In the method of manufacturing the surface-emitting laser element 100H, instead of the procedure (8) described above, the window is opened for contacting the p-side electrode by performing reactive ion etching with the use of $CF_4$ gas.

Figure 33:
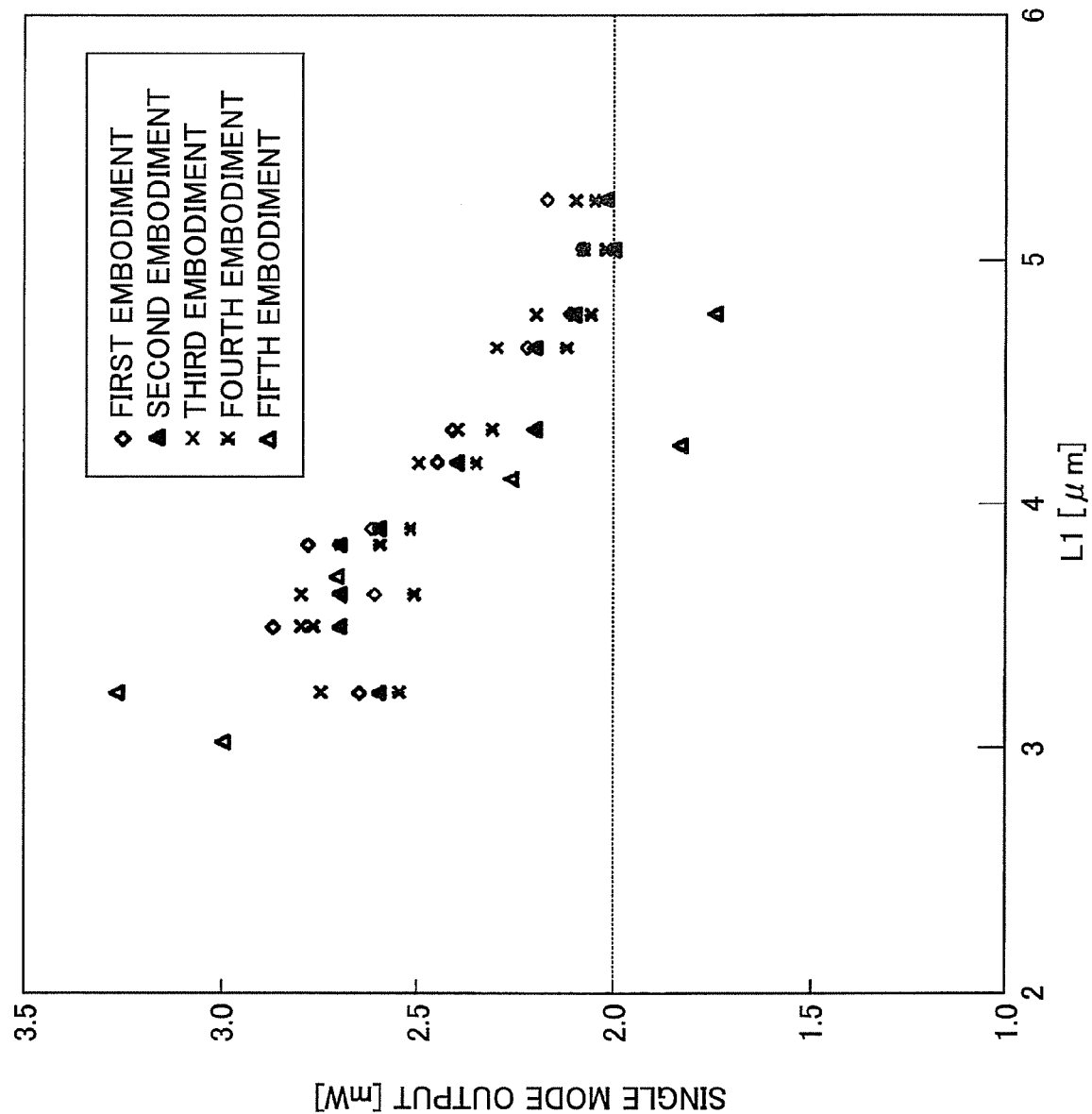
FIG. 33 illustrates the relationship between single mode output and the width of the opening of the mode filter for the surface-emitting laser elements of the first through fifth embodiments according to the present invention.

FIG. 33 illustrates the relationship between single mode output (SMP) and L1 described above for the surface-emitting laser elements of the first through fifth embodiments according to the present invention as described above, when the area of the current passing area is 16 $\mu m^2$. Accordingly, the range of L1 at which the single mode output becomes greater than or equal to 2.0 W, is 3 $\mu m$ through 5.3 $\mu m$ in the first through fourth embodiments and 3 $\mu m$ through 4.2 $\mu m$ in the fifth embodiment. These value ranges are wider than that of the conventional surface-emitting laser element. That is to say, in the embodiments of the present invention, the allowable range of L1 is wider than that of the conventional surface-emitting laser element. Therefore, the production yield ratio is higher than that of the conventional surface-emitting laser element.

Figure 34:
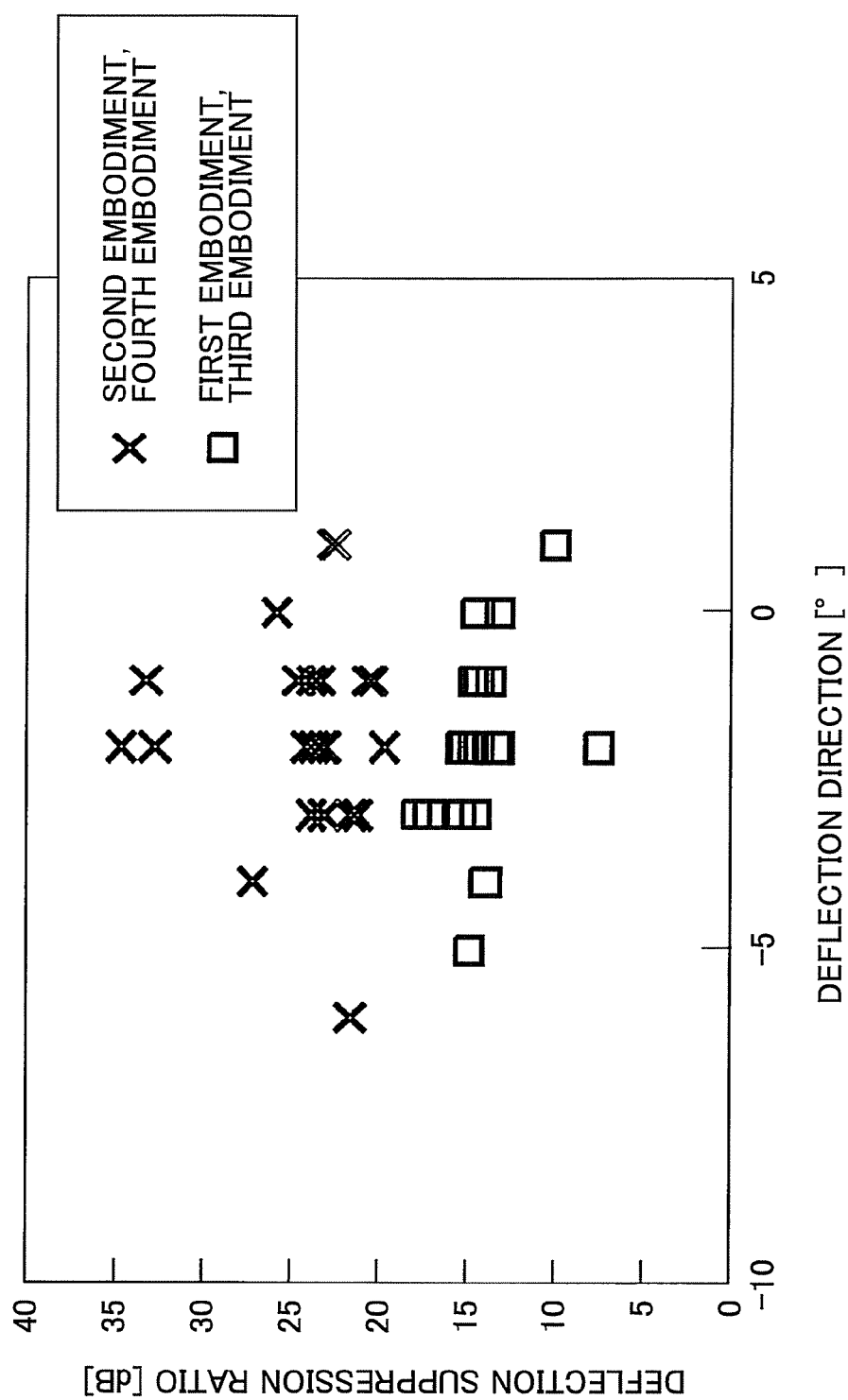
FIG. 34 illustrates the relationship between the deflection suppression ratio and the deflection direction in the surface-emitting laser elements according to the first to fourth embodiments of the present invention.

FIG. 34 illustrates the relationship between the deflection suppression ratio and the deflection direction in the surface-emitting laser elements according to the first to fourth embodiments of the present invention. As shown in FIG. 34, the deflection direction is near zero and the variation of the deflection direction is within six degrees in any of the embodiments. The deflection direction is indicated by the angle with respect to the Y axis direction. Thus, when the deflection direction is zero degrees, it means that the deflection direction is parallel to the Y axis direction.

Further more, in the second and fourth embodiments, the SiN film is divided into two parts so that the two parts face each other in the Y axis direction. Therefore, the oscillation threshold of light waves deflected in the Y axis direction decreases, so that the deflection stability in the Y axis direction improves. Accordingly, the deflection suppression ratio is greater than or equal to 19 db in these cases, thus presenting excellent deflection stability.

As described above, in the surface-emitting laser elements 100A through 100E according to embodiment of the present invention, the resonator structural body including the buffer layer 102, the lower semiconductor DBR 103, and the active layer 105; the upper semiconductor DBR 107; and the contact layer 109 are laminated on the substrate 101. Furthermore, the p-side electrode 113 is provided around the emitting region on the emitting surface from which laser beams are emitted. In the emitting region, a dielectric film is provided such that the reflection ratio of the peripheral part of the emitting region and the reflection ratio of the center part of the emitting region are different. The parts near the edges of the dielectric film are tilted with respect to the emitting surface.

In this case, the allowable range of the dimension L1 of the mask used for forming the dielectric film is wider than that of the conventional surface-emitting laser element. Therefore, the production yield ratio is higher than that of the conventional surface-emitting laser element. That is to say, the price of the surface-emitting laser element can be decreased.

In the optical scanning device 1010 according to an embodiment of the present invention, the light source 14 includes any one of the surface-emitting laser elements 100A through 100E, and therefore optical scanning can be performed in a stable manner while achieving low cost.

The laser printer 1000 according to an embodiment of the present invention includes the optical scanning device 1010, and therefore low cost can be achieved without degrading image quality.

In the surface-emitting laser elements 100A through 100E, higher-order transverse mode oscillation does not tend to occur even if the output is increased, despite the lost cost. Therefore, high optical output can be achieved in a single fundamental transverse-mode. Thus, microscopic circular beam spots can be formed with high precision. Additionally, since the output is high, the speed of scanning the photoconductive drum 1030 can be increased, such that highly precise images can be performed at high speed with the laser printer 1000.

In the above embodiments, the protection layer 111 is made of SiN; however, the present invention is not so limited. For example, the protection layer 111 may be made of any one of SiNx, SiOx, TiOx, and SiON. The same effects as those mentioned above can be achieved even if the thickness of the film is determined in accordance with the refractive index of the material.

Figure 35:
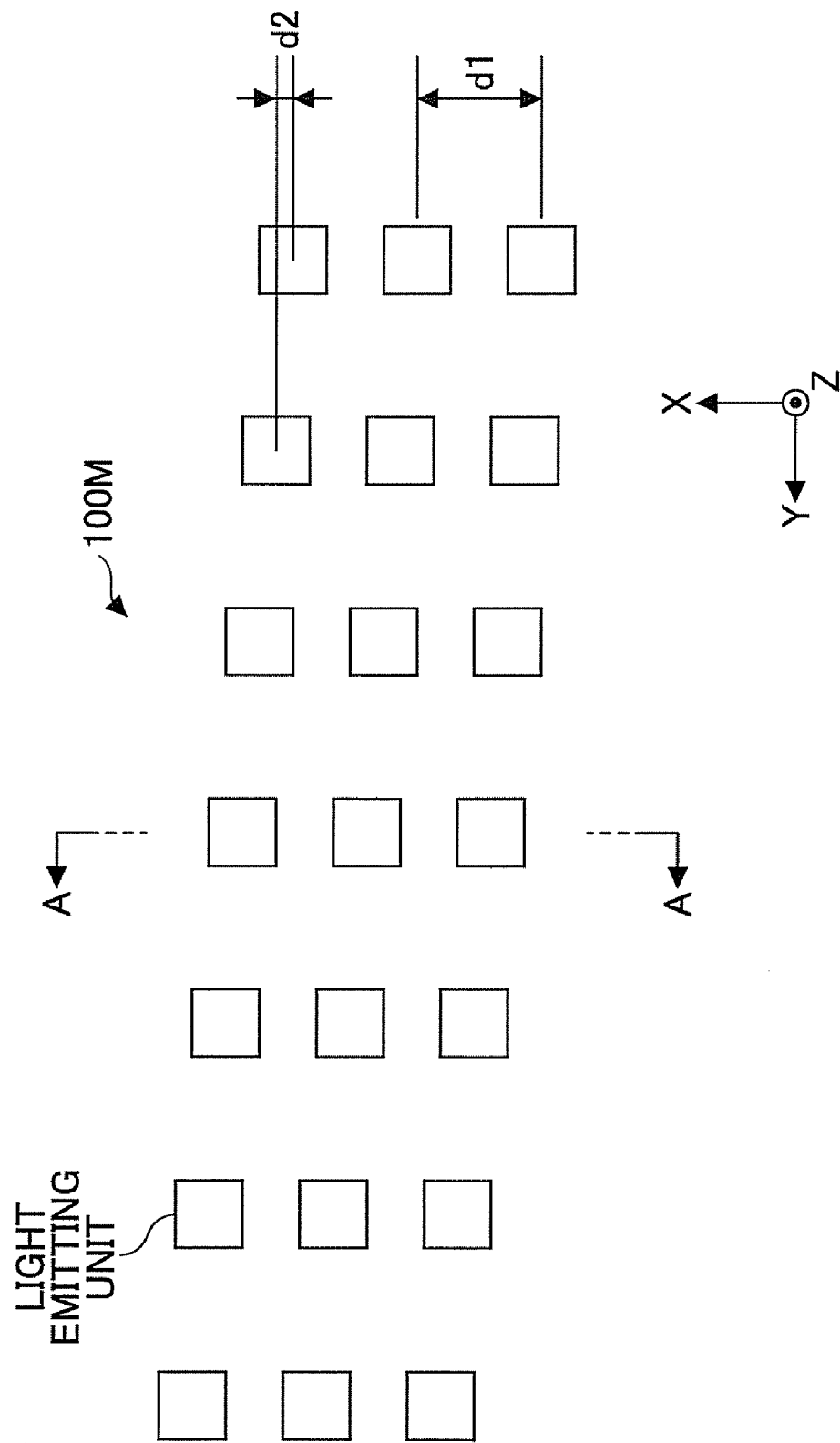
FIG. 35 is for describing a surface-emitting laser array.

In any of the above-described embodiments, a surface-emitting laser array 100M illustrated in FIG. 35 may be used in the light source 14 instead of the surface-emitting laser elements 100A through 100E.

In the surface-emitting laser array 100M, plural (21 in this example) light emitting units are arranged on the same substrate. In FIG. 35, the Y axis direction is the main scanning corresponding direction and the X axis direction is the sub scanning corresponding direction. The plural light emitting units are arranged such that they are equidistantly spaced apart (at light emitting unit intervals "d2") when all light emitting units are orthographically-projected on virtual lines extending in the Y axis direction. That is to say, the 21 light emitting units are arranged two-dimensionally. In the present application, a "light emitting unit interval" means the center-to-center distance between two light emitting units. Furthermore, the number of light emitting units is not limited to 21.

Figure 36:
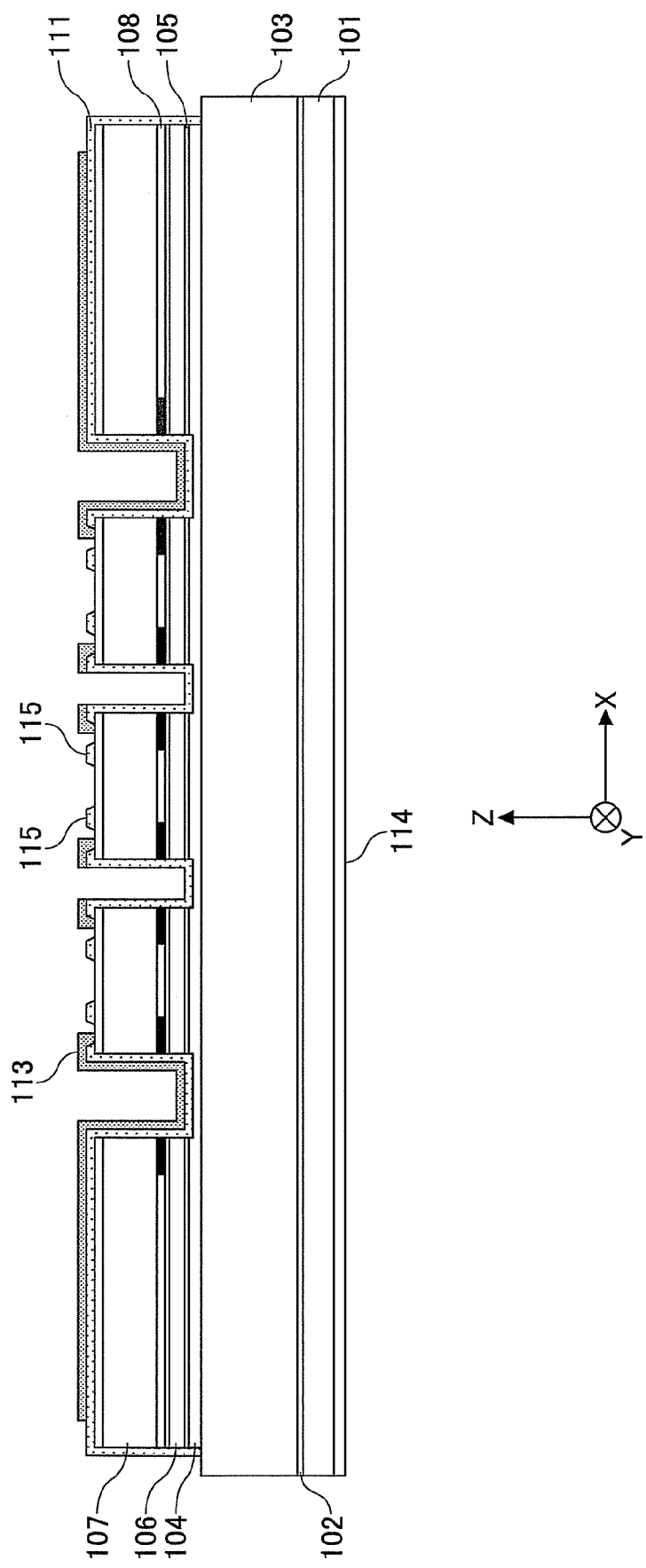
FIG. 36 is a cross-sectional view cut along a line A-A of FIG. 35.

Each of the light emitting units has the same structure as the surface-emitting laser element 100A as illustrated in FIG. 36, which is a cross-sectional view cut along a line A-A. Furthermore, the surface-emitting laser array 100M can be manufactured by the same method as that of the surface-emitting laser element 100A. Accordingly, the deflection direction is consistent among the light emitting units, and plural laser beams can be attained with high single mode output. Thus, 21 of circular, microscopic beam spots having high optical density can be simultaneously formed on the photoconductive drum 1030.

In the surface-emitting laser array 100M, the plural light emitting units are arranged such that they are equidistantly spaced apart (at light emitting unit intervals "d2") when all light emitting units are orthographically-projected on virtual lines extending in the sub scanning corresponding direction. Therefore, by adjusting the timings of lighting the light emitting units, the light beams emitted on the photoconductive drum 1030 may be the same as those of a case where light sources are equidistantly spaced apart in the sub scanning direction.

For example, assuming that the magnification ratio of the optical system is two, dots can be written on the photoconductive drum 1030 at intervals of 5.3 μm in the sub scanning direction. This corresponds to 4800 dpi (dots per inch). That is to say, the dots can be written at a high density of 4800 dpi. The density can be increased even more by increasing the number of surface-emitting lasers in the main scanning direction, or by forming an array in which the light emitting unit intervals "d2" are even more reduced by reducing the pitch "d1", or by decreasing the magnification ratio of the optical system. By increasing the density, the printing quality can be increased. The writing intervals in the main scanning direction can be easily controlled by adjusting the timings of lighting the light source.

In the laser printer 1000, even if the density of the written dots is increased, printing operations can be performed without reducing the printing speed. Furthermore, if the density of the written dots is the same as that of a conventional printer, the laser printer 1000 can perform printing operations at higher speed than that of a conventional printer.

In this case, the deflection directions of light beams from the light emitting units are stably aligned, and therefore high quality images can be stably formed with the laser printer 1000.

In the above embodiments, instead of using the surface-emitting laser elements 100A through 100E, a surface-emitting laser array including a one-dimensional arrangement of the same light emitting units as those of the surface-emitting laser elements 100A through 100E may be used.

In the above embodiments, the substrate is a tilted substrate; however, the present invention is not so limited. The substrate may not be tilted.

In the above embodiments, the light emitting units have an oscillation wavelength band of 780 nm; however, the present invention is not so limited. The oscillation wavelength band of each light emitting unit may be modified according to properties of the photoconductor.

The surface-emitting laser element may be used for purposes other than an image forming apparatus. In other examples, each light emitting unit may have an oscillation wavelength band of, for example, 650 nm, 850 nm, 980 nm, 1.3 μm, and 1.5 μm, depending on the purpose. In this case, the semiconductor material used for forming the active layer may be a mixed crystal semiconductor material according to the oscillation wavelength. For example, an AlGaInP system mixed crystal semiconductor material may be used for the oscillation wavelength band of 650 nm; an InGaAs system mixed crystal semiconductor material may be used for the oscillation wavelength band of 980 nm; and a GaInNAs(Sb) system mixed crystal semiconductor material may be used for the oscillation wavelength bands of 1.3 μm and 1.5 μm.

By selecting the material and structure of the reflection mirrors according to the oscillation wavelength, it is possible to form light emitting units corresponding to a desired oscillation wavelength. For example, a mixed crystal semiconductor material other than AlGaAs may be used, such as AlGaInP. The low refractive index layer and the high refractive index layer that are used in combination are preferably transparent with respect to the oscillation wavelength, and preferably have a large difference in the refractive index.

In the above embodiments, the optical scanning device 1010 is included in a printer. However, the optical scanning device 1010 is also appropriately applicable to an image forming apparatus other than a printer, such as a copier, a fax machine, or a multifunction peripheral in which functions of a copier and a fax machine are integrated.

Furthermore, in the above embodiments, the laser printer 1000 is given as an example of an image forming apparatus; however, the present invention is not so limited.

Furthermore, the image forming apparatus may be for directly emitting laser beams onto a medium (for example, a sheet) whose color is inverted in response to receiving laser beams.

For example, the medium may be rewritable paper. Rewritable paper is formed by applying the following materials as a recording layer, on a support body such as a paper sheet or a resin film. By controlling the heat energy of laser beams applied to the rewritable paper, the color of the rewritable paper is inverted, so that images are displayed or erased by the inverting reaction.

Either the transparent/opaque type rewritable marking method or the coloring/decoloring rewritable marking method using leuco dye may be applied.

The transparent/opaque type rewritable marking method is performed as follows. Fatty acid particles are dispersed in a high polymer thin film. When this material is heated at a temperature of 110° C. or more, the fatty acid melts and the resin expands. Subsequently, when the material is cooled, the fatty acid supercools and remains as liquid, while the expanded resin solidifies. The fatty acid solidifies and contracts and becomes polycrystalline particles, such that gaps are formed between the resin and the particles. Light is scattered due to these gaps, so that the corresponding portions appear to be white. Next, when the material is heated with a decoloring temperature ranging from 80° C. through 110° C., some of the fatty acid melts and the resin thermally-expands, such that the gaps are filled. When the material is cooled in this state, the corresponding portions become transparent, such that the image is erased.

The coloring/decoloring rewritable marking method using leuco dye is performed by the coloring/decoloring mechanism according to the inverting reaction between colorless leuco dye and a color developing/erasing agent having a long-chain alkyl group. When heat is applied by laser beams, the leuco dye and the color developing/erasing agent react to the heat and generate color. Then, when these materials are rapidly cooled, the color is maintained. Subsequently, when the materials are heated, and then slowly cooled, phase separation occurs due to autoagglutination of the long-chain alkyl group of the color developing/erasing agent. Therefore, the leuco dye and the color developing/erasing agent are physically separated, and the color disappears.

Furthermore, the medium may be color rewritable paper formed by applying the following materials on a support body such as a paper sheet or a resin film. One type of the materials is a photo-chromic compound that generates a cyan (C) color in response to receiving ultraviolet rays, and erases the cyan color in response to receiving red visible light. Another type of the materials is a photo-chromic compound that generates a magenta (M) color in response to receiving ultraviolet rays, and erases the magenta color in response to receiving green visible light. Yet another type of the materials is a photochromic compound that generates a yellow (Y) color in response to receiving ultraviolet rays, and erases the yellow color in response to receiving blue visible light.

With this paper, it is possible to express full color as follows. First, a completely black color is temporarily attained by emitting ultraviolet rays. Then, the color densities of the three types of materials that generate Y, M, and C colors are controlled by adjusting the time and intensity of emitting the R, G, and B light beams, to express full-color. For example, it is possible to attain a completely white color by emitting intense R, G, and B light beams to erase all three colors.

An image forming apparatus that controls light energy to invert colors may also be applied as the image forming apparatus including the optical scanning device according to the present embodiment.

Furthermore, the image forming apparatus including the optical scanning device according to the present embodiment may use a silver salt film as the image carrier. In this case, a latent image is formed on the silver salt film by optical scanning, and this latent image may be turned into a visible image by the same developing process as that performed for developing a typical silver salt photograph. Furthermore, the same photofinishing process as that performed for a typical silver salt photograph may be performed to transfer the visible image onto a print sheet. This kind of image forming apparatus may be implemented as an optical plate making device or an optical drawing device for drawing CT scan images.

Figure 37:
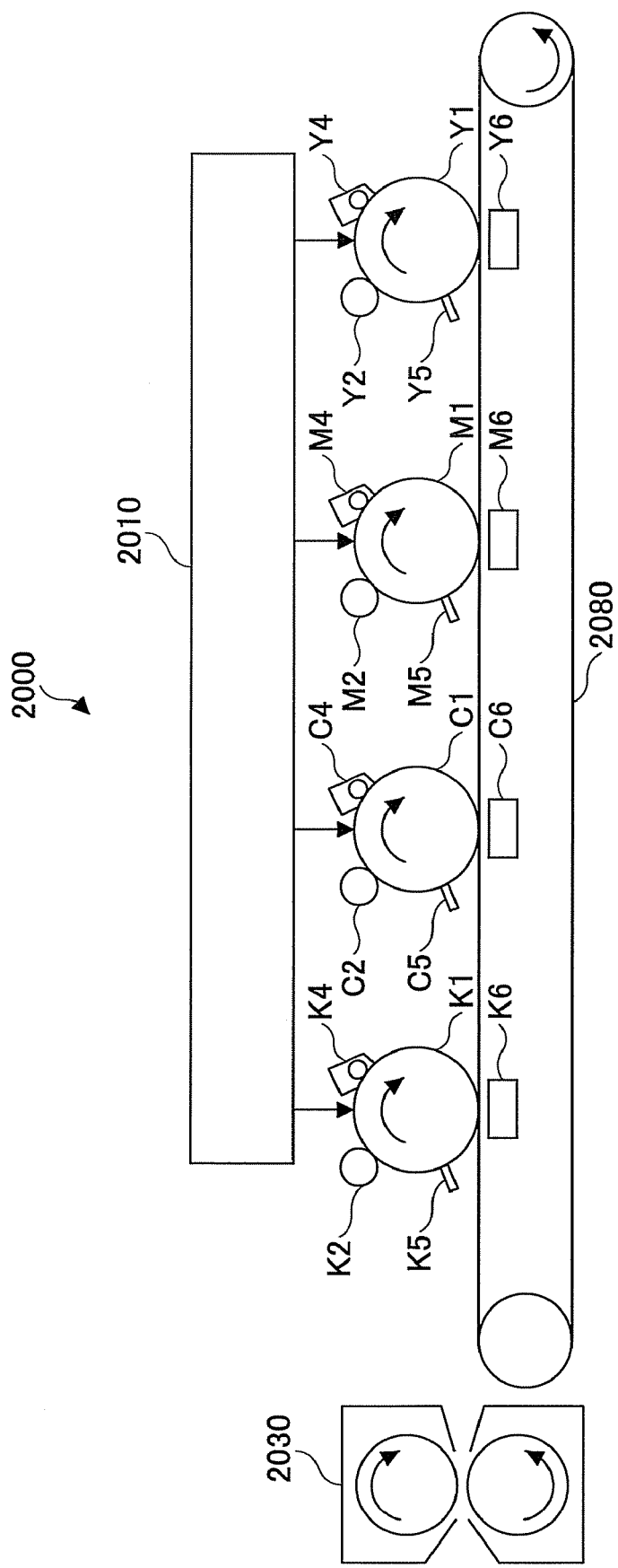
FIG. 37 illustrates a schematic configuration of a color printer.

Furthermore, the image forming apparatus including the optical scanning device according to the present embodiment may be a color printer 2000 including plural photoconductive drums, as illustrated in FIG. 37.

The color printer 2000 is a tandem type multicolor printer that forms a full color image by superposing four monochrome images of respective colors (black, cyan, magenta, and yellow). The color printer 2000 includes a station for black (a photoconductive drum K1, a charging device K2, a developing device K4, a cleaning unit K5, and a transfer device K6), a station for cyan (a photoconductive drum C1, a charging device C2, a developing device C4, a cleaning unit C5, and a transfer device C6), a station for magenta (a photoconductive drum M1, a charging device M2, a developing device M4, a cleaning unit M5, and a transfer device M6), a station for yellow (a photoconductive drum Y1, a charging device Y2, a developing device Y4, a cleaning unit Y5, and a transfer device Y6), an optical scanning device 2010, a transfer belt 2080, and a fixing unit 2030.

The photoconductive drums rotate in directions indicated by arrows in FIG. 37. Around each photoconductive drum, the charging device, the developing device, the transfer device, and the cleaning unit are arranged along the rotation direction of the photoconductive drum. The charging devices uniformly charge the surfaces of the corresponding photoconductive drums. The optical scanning device 2010 emits light beams onto the surfaces of the photoconductive drums that have been charged by the corresponding charging devices, so that latent images are formed on the photoconductive drums. Then, the developing devices form toner images on the surfaces of the corresponding photoconductive drums. Then, the transferring devices sequentially transfer the corresponding toner images onto a recording sheet on the transfer belt 2080. Finally, the fixing unit 2030 fixes the images onto the recording sheet.

The optical scanning device 2010 includes a surface-emitting laser element that is similar to any one of the surface-emitting laser elements 100A through 100E or a surface-emitting laser array that is similar to the surface-emitting laser array 100M. Thus, the same effects as those of the optical scanning device 1010 can be achieved. Furthermore, the color printer 2000 includes the optical scanning device 2010, and therefore the same effects as those of the laser printer 1000 can be achieved.

In the color printer 2000, color shift may occur due to manufacturing errors and positional errors of the components. However, if the light sources of the optical scanning device 2010 include the same surface-emitting laser array as the surface-emitting laser array 100M, color shift may be reduced by selecting the light emitting units to be lit.

As described above, with the surface-emitting laser element and the surface-emitting laser array according to embodiments of the present invention, production yield can be increased. Furthermore, with the optical scanning device according to an embodiment of the present invention, optical scanning can be performed in a stable manner while reducing cost. Furthermore, with the image forming apparatus according to an embodiment of the present invention, costs can be reduced without degrading the image quality.

The present invention is not limited to the specific embodiments described herein, and variations and modifications may be made without departing from the scope of the present invention.

The present application is based on Japanese Priority Patent Application No. 2009-268226, filed on Nov. 26, 2009, and Japanese Priority Patent Application No. 2010-156453, filed on Jul. 9, 2010, the entire contents of which are hereby incorporated herein by reference.

What is claimed is:

1. A surface-emitting laser element comprising:
a substrate;
a plurality of semiconductor layers laminated on the substrate, the plural semiconductor layers including
a resonator structural body including an active layer and semiconductor multilayer film reflection mirrors having the resonator structural body sandwiched therebetween;
a contact layer having a top surface;
an electrode formed directly on the top surface of the contact layer, and provided in such a manner as to surround an emitting region on a surface of the surface-emitting laser element from which light is emitted; and
a dielectric film formed on top of and in direct contact with the top surface of the contact layer, and provided in the emitting region such that a reflection ratio of a peripheral part of the emitting region is different from a reflection ratio of a center part of the emitting region, wherein
edge portions that are near edges of the dielectric film are tilted with respect to the surface; and
the dielectric film is provided in at least one small area included in the emitting region, the at least one small area not being included in the center part of the emitting region.

2. The surface-emitting laser element according to claim 1, wherein
the dielectric film is provided such that a reflection ratio of the at least one small area is lower than the reflection ratio of the center part of the emitting region.

3. The surface-emitting laser element according to claim 2, wherein
the dielectric film has shape anisotropy in a cross-sectional plane parallel to the surface from which light is emitted.

4. The surface-emitting laser element according to claim 3, wherein the at least one small area corresponds to plural small areas, and the plural small areas are facing each other across the center part of the emitting region as viewed in a direction from which light is emitted.

5. The surface-emitting laser element according to claim 2, wherein a center portion of the dielectric film has an optical thickness that is an odd multiple of an oscillation wavelength/4.

6. The surface-emitting laser element according to claim 2, wherein the dielectric film is made of any one of SiNx, SiOx, TiOx, and SiON.

7. The surface-emitting laser element according to claim 6, wherein the dielectric film is made of any one of SiNx, TiOx, and SiON, and the dielectric film is formed by wet etching with the use of buffered hydrofluoric acid.

8. The surface-emitting laser element according to claim 2, wherein an area of the emitting region having a relatively high reflection ratio compared to other areas of the emitting region is covered by another dielectric film, and the other dielectric film covering the area of the emitting region having the relatively high reflection ratio has an optical thickness that is an even multiple of an oscillation wavelength/4.

9. The surface-emitting laser element according to claim 8, wherein the other dielectric film covering the area of the emitting region having the relatively high reflection ratio is made of the same material as that of the dielectric film formed in the at least one small area.

10. The surface-emitting laser element according to claim 8, wherein the other dielectric film covering the area of the emitting region having the relatively high reflection ratio is formed by laminating plural films having different refractive indices.

11. The surface-emitting laser element according to claim 10, wherein the plural films have an optical thickness that is an odd multiple of the oscillation wavelength/4.

12. The surface-emitting laser element according to claim 1, wherein the dielectric film is provided in the center part of the emitting region such that the reflection ratio of the center part of the emitting region is higher than the reflection ratio of the peripheral part of the emitting region, and the dielectric film is formed by laminating plural films having different refractive indices.

13. The surface-emitting laser element according to claim 12, wherein the plural films have an optical thickness that is an odd multiple of an oscillation wavelength/4.

14. The surface-emitting laser element according to claim 2, wherein in the emitting region, an area other than the at least one small area is covered by another dielectric film.

15. A surface-emitting laser array in which the surface-emitting laser elements according to claim 1 are integrated.

16. An optical scanning device for scanning a scan target surface with light, the optical scanning device comprising:

a light source including the surface-emitting laser element according to claim 1;

a deflector that deflects the light from the light source; and a scanning optical system that focuses the light that has been deflected by the deflector on the scan target surface.

17. An optical scanning device for scanning a scan target surface with light, the optical scanning device comprising:

a light source including the surface-emitting laser array according to claim 15;

a deflector that deflects the light from the light source; and a scanning optical system that focuses the light that has been deflected by the deflector on the scan target surface.

18. An image forming apparatus comprising:

at least one image carrier; and at least one of the optical scanning device according to claim 16 that scans the at least one image carrier with light that has been modulated in accordance with image information.

19. The image forming apparatus according to claim 18, wherein the image information is multicolor image information.

* * * * *